US010559656B2

(12) United States Patent
Bourjot et al.

(10) Patent No.: US 10,559,656 B2
(45) Date of Patent: Feb. 11, 2020

(54) WRAP-ALL-AROUND CONTACT FOR NANOSHEET-FET AND METHOD OF FORMING SAME

(71) Applicant: GLOBALFOUNDRIES INC., Grand Cayman (KY)

(72) Inventors: Emilie M. S. Bourjot, Cohoes, NY (US); Julien Frougier, Albany, NY (US); Yi Qi, Niskayuna, NY (US); Ruilong Xie, Schenectady, NY (US); Hui Zang, Guilderland, NY (US); Hsien-Ching Lo, Clifton Park, NY (US); Zhenyu Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/968,968

(22) Filed: May 2, 2018

(65) Prior Publication Data

US 2019/0341448 A1 Nov. 7, 2019

(51) Int. Cl.

| | |
|---|---|
| ***H01L 29/06*** | (2006.01) |
| ***H01L 29/417*** | (2006.01) |
| ***H01L 29/78*** | (2006.01) |
| ***H01L 29/66*** | (2006.01) |
| ***H01L 29/08*** | (2006.01) |
| ***H01L 21/285*** | (2006.01) |

(52) U.S. Cl.

CPC .... *H01L 29/0653* (2013.01); *H01L 21/28518* (2013.01); *H01L 29/0847* (2013.01); *H01L 29/41733* (2013.01); *H01L 29/41791* (2013.01); *H01L 29/6653* (2013.01); *H01L 29/6656* (2013.01); *H01L 29/6681* (2013.01); *H01L 29/7853* (2013.01); *H01L 2029/7858* (2013.01)

(58) Field of Classification Search

CPC ..... H01L 29/0665; H01L 29/0669–068; H01L 29/7853–2029/7858; H01L 29/78687; H01L 29/78696; H01L 29/0642; H01L 29/0649; H01L 29/0653; H01L 29/41725–41791; H01L 29/7839; H01L 29/806

See application file for complete search history.

(56) References Cited

U.S. PATENT DOCUMENTS

| | | | | |
|---|---|---|---|---|
| 7,531,437 | B2 | 5/2009 | Brask et al. | |
| 7,534,675 | B2 | 5/2009 | Bangsaruntip et al. | |
| 9,847,390 | B1 * | 12/2017 | Xie | H01L 29/0673 |
| 10,008,583 | B1 * | 6/2018 | Rodder | H01L 29/7848 |
| 10,141,431 | B1 * | 11/2018 | Hung | H01L 21/76232 |
| 10,170,520 | B1 * | 1/2019 | Frougier | H01L 21/823431 |
| 10,192,867 | B1 * | 1/2019 | Frougier | H01L 29/66439 |
| 2011/0147840 | A1 | 6/2011 | Cea et al. | |
| 2012/0007051 | A1 | 1/2012 | Bangsaruntip et al. | |

(Continued)

*Primary Examiner* — Scott B Geyer

(74) *Attorney, Agent, or Firm* — Anthony Canale; Hoffman Warnick LLC

(57) ABSTRACT

Described herein are nanosheet-FET structures having a wrap-all-around contact where the contact wraps entirely around the S/D epitaxy structure, thereby increasing contact area and ultimately allowing for improved S/D contact resistance. Other aspects described include nanosheet-FET structures having an air gap as a bottom isolation area to reduce parasitic S/D leakage to the substrate.

9 Claims, 40 Drawing Sheets

(56) References Cited

U.S. PATENT DOCUMENTS

| | | | | |
|---|---|---|---|---|
| 2014/0001520 | A1 | 1/2014 | Glass et al. | |
| 2018/0114834 | A1* | 4/2018 | Cheng ................. | H01L 29/0673 |
| 2018/0277656 | A1* | 9/2018 | Chao ................. | H01L 29/66553 |
| 2019/0165118 | A1* | 5/2019 | Leobandung ..... | H01L 29/42392 |
| 2019/0198616 | A1* | 6/2019 | Coquand ............. | H01L 29/0847 |
| 2019/0214502 | A1* | 7/2019 | Xu .................... | H01L 29/78618 |

* cited by examiner

WRAP-ALL-AROUND CONTACT FOR NANOSHEET-FET AND METHOD OF FORMING SAME

TECHNICAL FIELD

The subject matter disclosed herein relates to wrap-all-around contacts for nanosheet field effect transistors (nanosheet-FETs) of semiconductors. More specifically, various aspects described herein relate to wrap-all-around contacts of source/drain (S/D) epitaxy structures for nanosheet-FETs and methods of forming the same.

BACKGROUND

As integrated circuits continue to scale downward in size, the finFET is still an attractive device for use in semiconductor integrated circuits (ICs). With finFETs, as with other transistor types, contacts that connect to the source, drain, and gate of the transistor to other structure are an important factor in the production of reliable integrated circuits with desired performance characteristics. More specifically, source/drain (S/D) contact resistance is highly dependent on contact interface area. In conventional finFET devices, the contact area for S/D regions is the top of the S/D regions and is constant as the fin height increases. In advanced finFET devices, the contact area for S/D regions is the side of the S/D regions, thereby causing non-optimal drive current scaling as the fin height increases due to a small contact interface area. In other finFET devices, a partial wrap-around contact is formed on the top and sides of the S/D regions in an attempt to increase the contact interface area.

In the case of nanosheet-FETs, a particular type of finFETs, S/D epitaxy grows from the sides (edges) of the silicon layers (sheets) of the nanosheet stacks as well as the silicon substrate. Without isolation of the S/D contacts from the substrate, parasitic S/D leakage may occur which decreases nanosheet-FET performance.

BRIEF SUMMARY

Wrap-all-around contacts of source/drain (S/D) epitaxy structures for nanosheet-FETs and methods of forming the same are disclosed. In a first aspect of the disclosure, a field effect transistor (FET) structure having a wrap-all-around contact includes: a substrate; at least two nanosheet stacks, each nanosheet stack being formed over the substrate; a gate structure over each nanosheet stack; a source/drain (S/D) epitaxy structure between adjacent nanosheet stacks; a conformal or partially conformal contact layer formed all around the S/D epitaxy structure, thereby forming the wrap-all-around contact; and a cavity located between a lower surface of the wrap-all-around contact and an upper surface of the substrate.

In a second aspect of the disclosure, a FET structure having a wrap-all-around contact includes: a substrate having at least two mandrel portions; a conformal oxide layer on the substrate, the conformal oxide layer having a thickness such that a cavity between adjacent mandrel portions is present; a nanosheet stack over each mandrel portion; a gate structure over each nanosheet stack; a source/drain (S/D) epitaxy structure between adjacent nanosheet stacks, the S/D epitaxy structure having a shape that does not fill the cavity and such that a gap is present between the S/D epitaxy structure and an uppermost edge of the oxide layer present in the cavity and on sidewalls of the mandrel portions; a conformal or partially conformal silicide layer formed all around the S/D epitaxy structure and thereby forming the wrap-all-around contact, the silicide layer having a thickness such that the silicide layer does not fill the gap; and a conformal liner layer formed on at least a portion of the silicide layer and having a thickness such that the gap is pinched off by the conformal liner layer.

In a third aspect of the disclosure, a method of making a field effect transistor (FET) structure having a wrap-all-around contact includes: forming at least two nanosheet stacks, each nanosheet stack being formed over a substrate; forming a gate structure over each nanosheet stack; epitaxially growing a source/drain (S/D) epitaxy structure between adjacent nanosheet stacks; and forming a conformal or partially conformal contact layer all around the S/D epitaxy structure, thereby forming the wrap-all-around contact; wherein a cavity is formed below a lower surface of the S/D epitaxy structure and above an upper surface of the substrate.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

FIGS. 9A, 9B through FIGS. 21A, 21B depict a second embodiment of the disclosure wherein a FET structure having a wrap-all-around contact includes a bottom isolation composed of a dielectric material. In these drawings, those figures labeled with an 'A' show a cross-sectional view (through gate) and those labeled with a 'B' show a cross-sectional view (through fin) of the same relevant structure.

FIGS. 22A, 22B through FIGS. 31A, 31B depict a third embodiment of the disclosure wherein a FET structure having a wrap-all-around contact includes a liner encapsulated bottom isolation composed of an insulating material. In these drawings, those figures labeled with an 'A' show a cross-sectional view (through gate) and those labeled with a 'B' show a cross-sectional view (through fin) of the same relevant structure.

FIGS. 32A, 32B through FIGS. 42A, 42B depict a fourth embodiment of the disclosure wherein a FET structure having a wrap-all-around contact includes a liner encapsulated air gap bottom isolation. In these drawings, those figures labeled with an 'A' show a cross-sectional view (through gate) and those labeled with a 'B' show a cross-sectional view (through fin) of the same relevant structure.

Figure 1A:
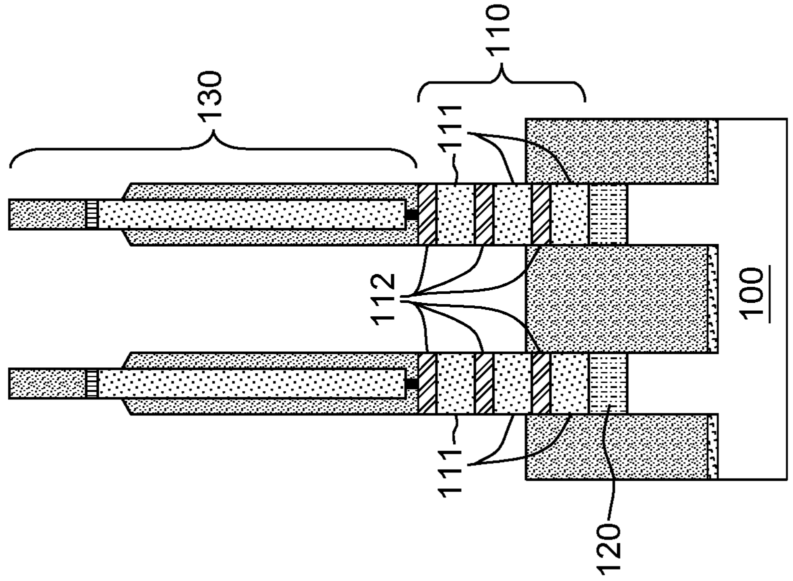
FIGS. 1A, 1B, 2A, 2B, 3, 4, 5, 6A, 6B, 7A, 7B, 8A and 8B depict a first embodiment of the disclosure wherein a FET structure having a wrap-all-around contact includes an air gap bottom isolation. In these drawings, those figures without a letter designation show a cross-sectional view of a relevant structure, and those figures labeled with an 'A' show a cross-sectional view (through gate) and those labeled with a 'B' show a perspective view of the same relevant structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to wrap-all-around contacts for nanosheet field effect transistors (nanosheet-FETs) of semiconductors. More specifically, various aspects described herein relate to wrap-all-around contacts of source/drain (S/D) epitaxy structures for nanosheet-FETs and methods of forming the same.

As noted above, conventional nanosheet-FETs suffer from non-optimal S/D contact resistance due to limited contact area and also suffer from parasitic S/D leakage to the substrate due to a lack of bottom isolation. In contrast to convention, various aspects of the disclosure include nanosheet-FET structures having a wrap-all-around contact where the contact wraps entirely around the S/D epitaxy structure, not just on the top and sides of the S/D epitaxy structure, and thus increases contact area. Other aspects of the disclosure include nanosheet-FET structures having a bottom isolation (e.g., air gap cavity, filled cavity) to reduce parasitic S/D leakage to the substrate. Numerous ways to include such a wrap-all-around contact and bottom isolation in nanosheet-FETs are possible while still adhering to the essence of the disclosure.

FIGS. 1A, 1B, 2A, 2B, 3, 4, 5, 6A, 6B, 7A, 7B, 8A and 8B depict a first embodiment of the disclosure, FIGS. 9A, 9B through FIGS. 21A, 21B depict a second embodiment of the disclosure, FIGS. 22A, 22B through FIGS. 31A, 31B depict a third embodiment of the disclosure, and FIGS. 32A, 32B through FIGS. 42A, 42B depict a fourth embodiment of the disclosure.

A step-by-step depiction of producing a first embodiment of the disclosure is illustrated in FIGS. 1A, 1B, 2A, 2B, 3, 4, 5, 6A, 6B, 7A, 7B, 8A and 8B. Cross-gate views are the "A" portion (left) and perspective views are the "B" portion (right) in the Figures and both are shown for ease of comprehension.

Figure 1B:
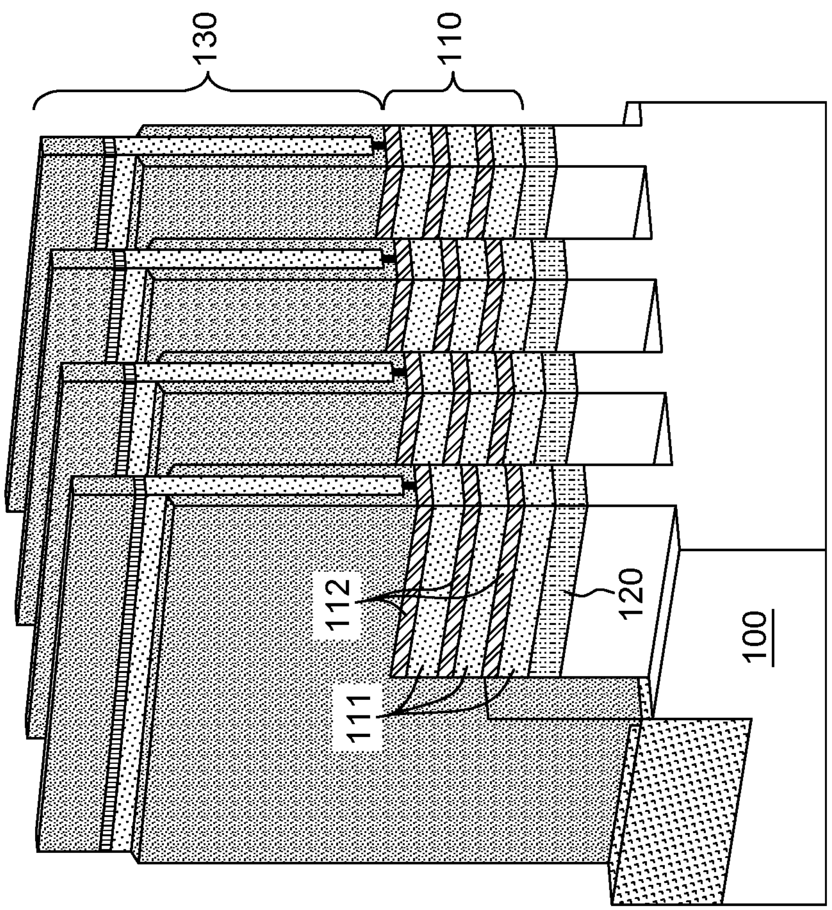

FIGS. 1A, 1B depict a partial FET structure including a substrate 100 and at least two nanosheet stacks 110, each nanosheet stack 110 being formed over substrate 100. Each nanosheet stack 110 includes alternating sheets of silicon germanium (SiGe) 111 and silicon (Si) 112. Substrate 100 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

A sacrificial silicon germanium (SiGe) layer 120 is formed on the substrate such that sacrificial SiGe layer 120 is located between substrate 100 and each nanosheet stack 110. Sacrificial SiGe layer 120 differs from SiGe layers 111 of nanosheet stacks 110 in that sacrificial SiGe layer 120 has a higher Ge percent content allowing for selectivity between sacrificial SiGe layer 120 and SiGe layers 111 of nanosheet stacks 110. A gate structure 130 is formed over each nanosheet stack 110.

Figure 2B:
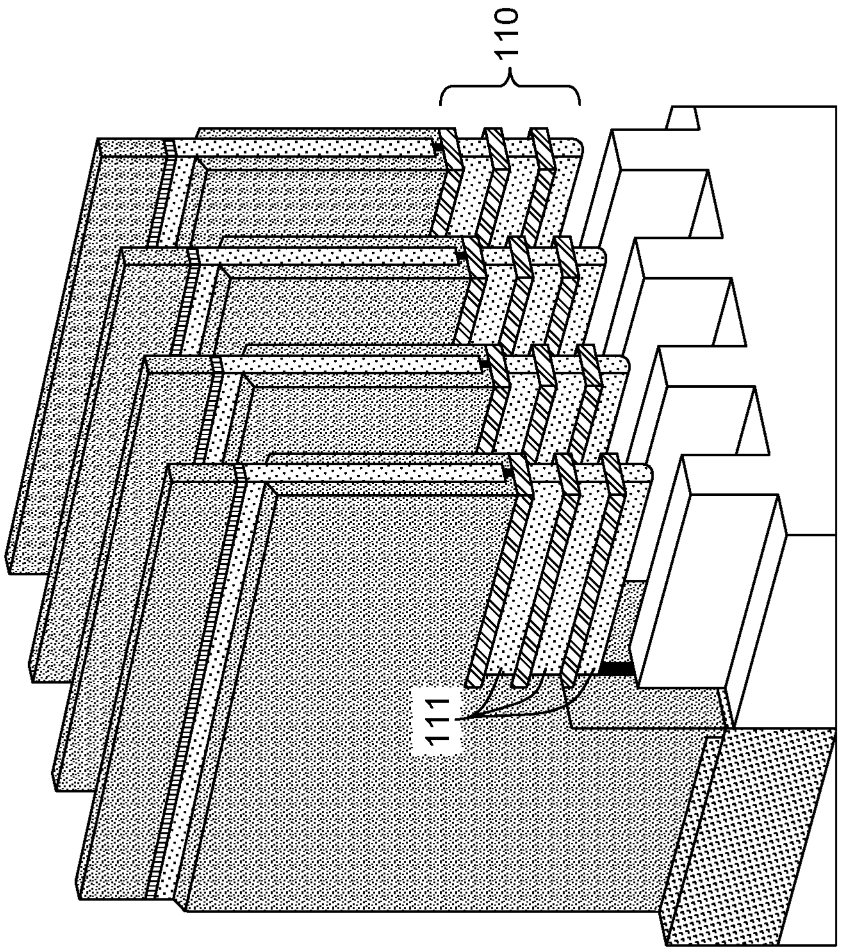
Figure 2A:
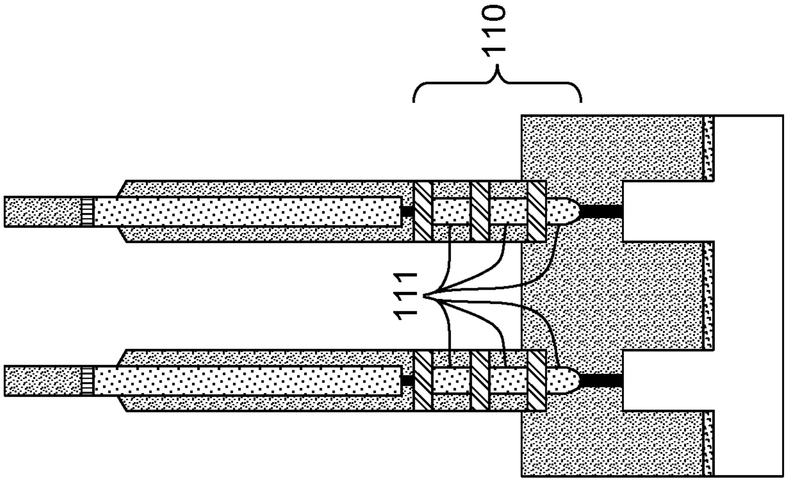

FIGS. 2A, 2B depict removal of sacrificial SiGe layer 120 (FIG. 1) and partial indentation of SiGe layers 111 of each nanosheet stack 110. Said removal can be attained by any currently known or later developed removal techniques including, for example, etching. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 3:
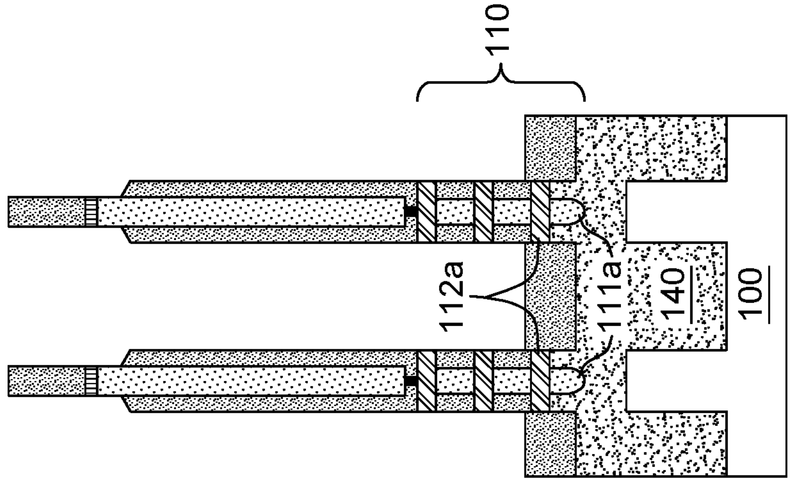

FIG. 3 (cross-gate view only) depicts deposition of an oxide layer 140 on substrate 100, followed by isotropic etching (recessing) of oxide layer 140 to a level below a lowest Si layer 112*a* of each nanosheet stack 110 and no lower than a lowest indented SiGe layer 111*a* of each nanosheet stack 110. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Oxide layer 140 may be comprised of, for example, high density plasma silicon oxide.

Figure 4:
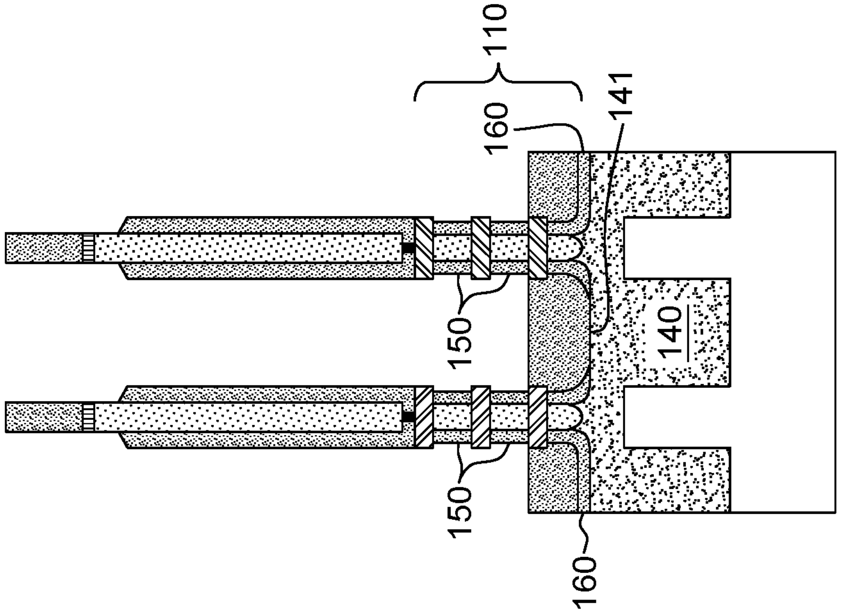

FIG. 4 (cross-gate view only) depicts forming inner spacers 150 on edges of SiGe layers 111 of each nanosheet stack 110 followed by recessing of inner spacers 150. FIG. 4 also shows forming an inner spacer layer 160 on a top surface 141 of oxide layer 140. Inner spacers 150 and inner spacer layer 160 may be formed by deposition of an inner spacer material. The inner spacer material can be, for example, SiBCN, SiNC or SiN.

Figure 5:
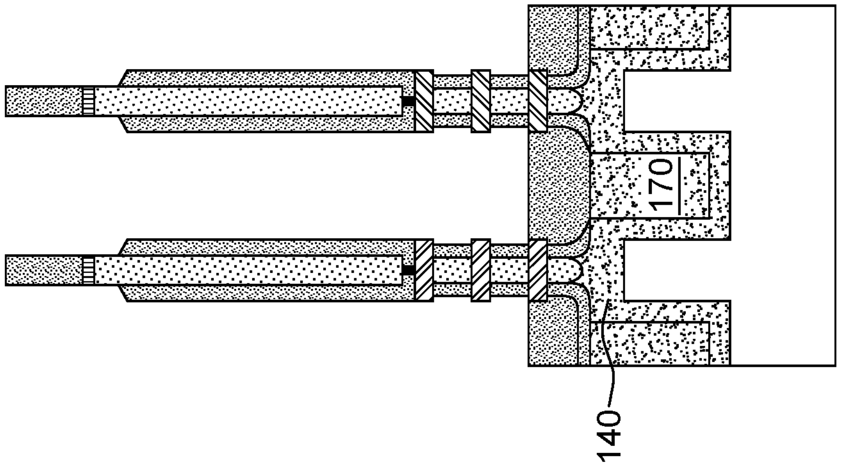

FIG. 5 (cross-gate view only) depicts forming a cavity 170 via directional etching (e.g., direction RIE) into oxide layer 140.

Figure 6B:
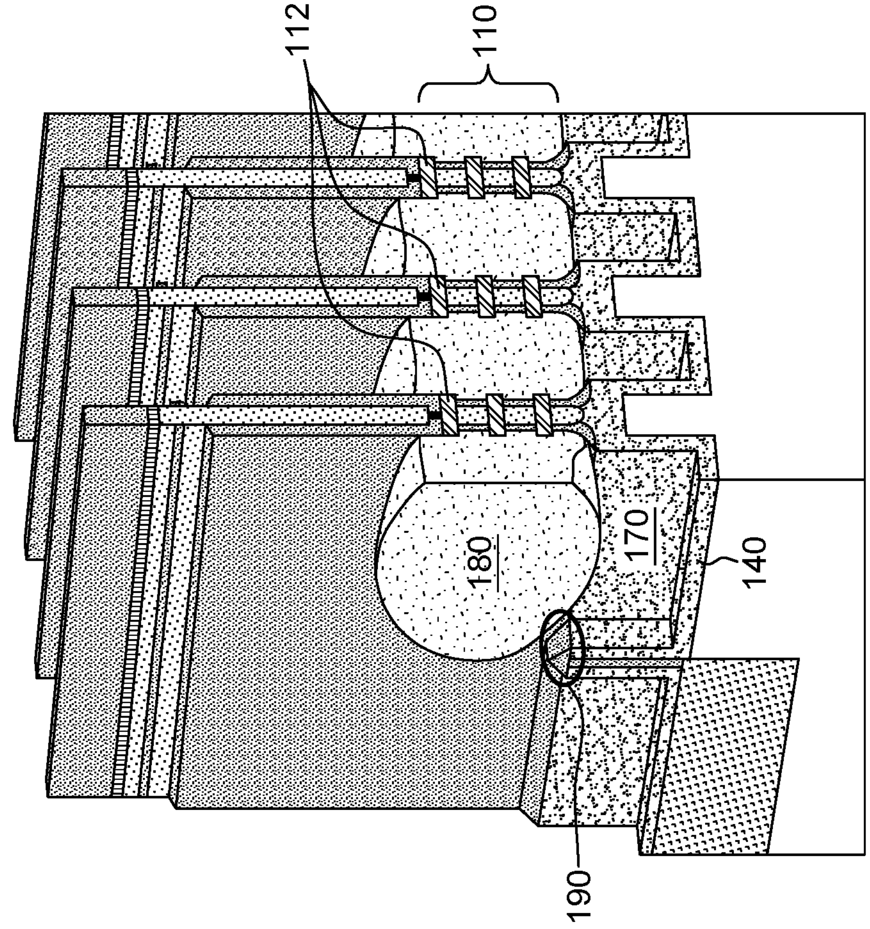
Figure 6A:
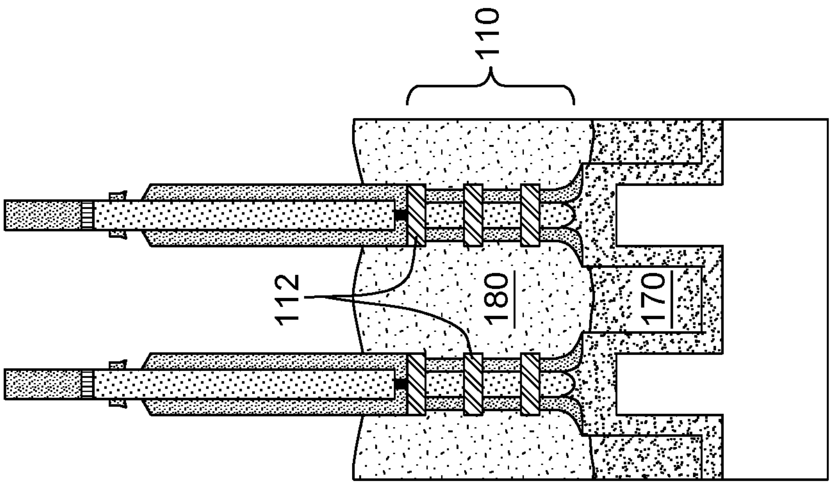

FIGS. 6A, 6B depict epitaxial growth of a source/drain (S/D) epitaxy structure 180 between adjacent nanosheet stacks 110 and from edges of Si layers 112 of nanosheet stacks 110. The epitaxial growth can be a pFET/nFET dual epitaxial growth as shown in FIG. 6. It is noted that a gap 190 (see FIG. 6B) is present between S/D epitaxy structure 180 and an uppermost edge of oxide layer 140 present in cavity 170. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface.

Figure 7B:
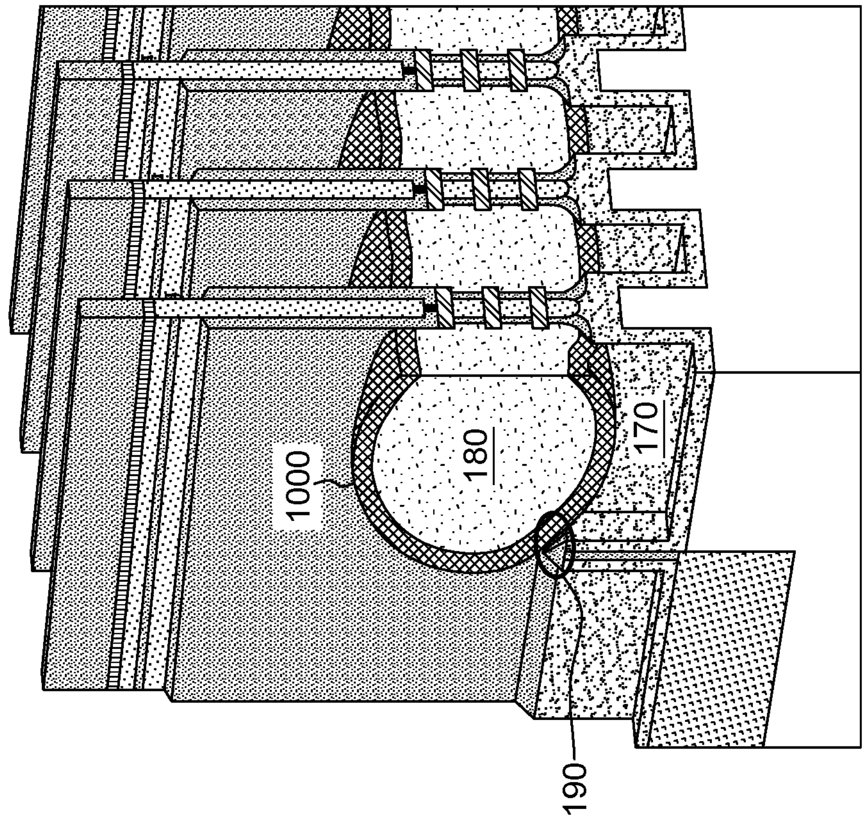
Figure 7A:
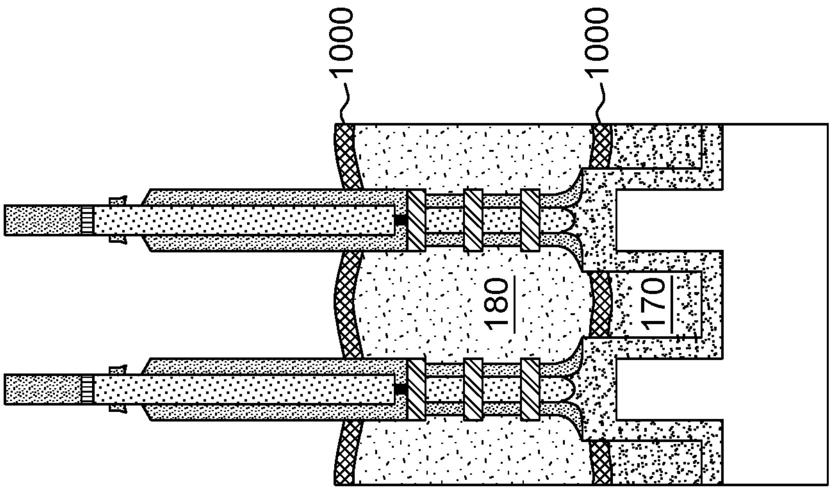

FIGS. 7A, 7B depict forming a conformal contact layer 1000 all around S/D epitaxy structure 180. Contact layer 1000 may be partially conformal rather than fully conformal as depicted. Conformal contact layer 1000 may also be referred to as a "wrap-all-around contact." Wrap-all-around contact 1000 provides increased contact interface area by wrapping all around S/D epitaxy structure 180, including below structure 180, as compared to conventional wrap-around contacts which do not wrap entirely around the S/D epitaxy structure because they do not wrap below the S/D epitaxy structure. Such increased contact interface area can improve transistor performance. Conformal contact layer 1000 may be comprised of, for example, titanium silicide ($TiSi_x$). It is further noted that gap 190 (see FIG. 7B) still exists after the formation of conformal contact layer 1000, though to a lesser extent than that shown in FIG. 6B.

Figure 8A:
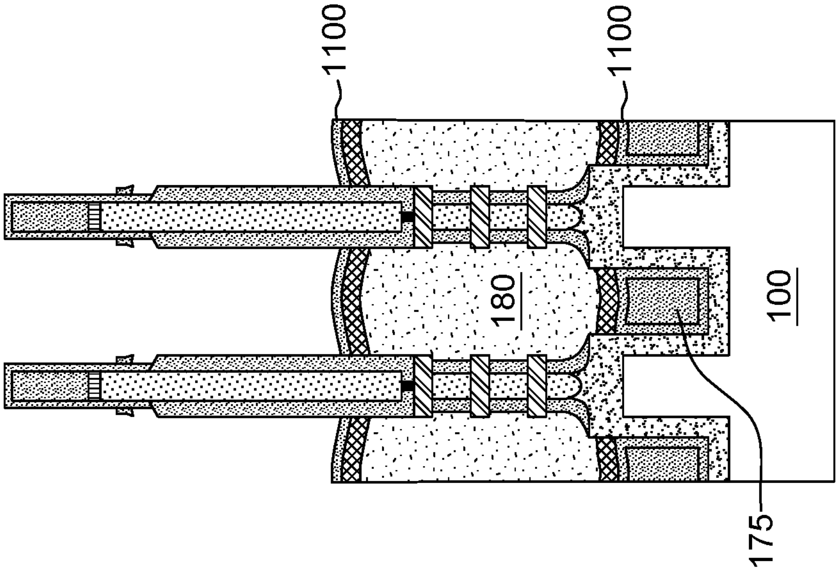
Figure 8B:
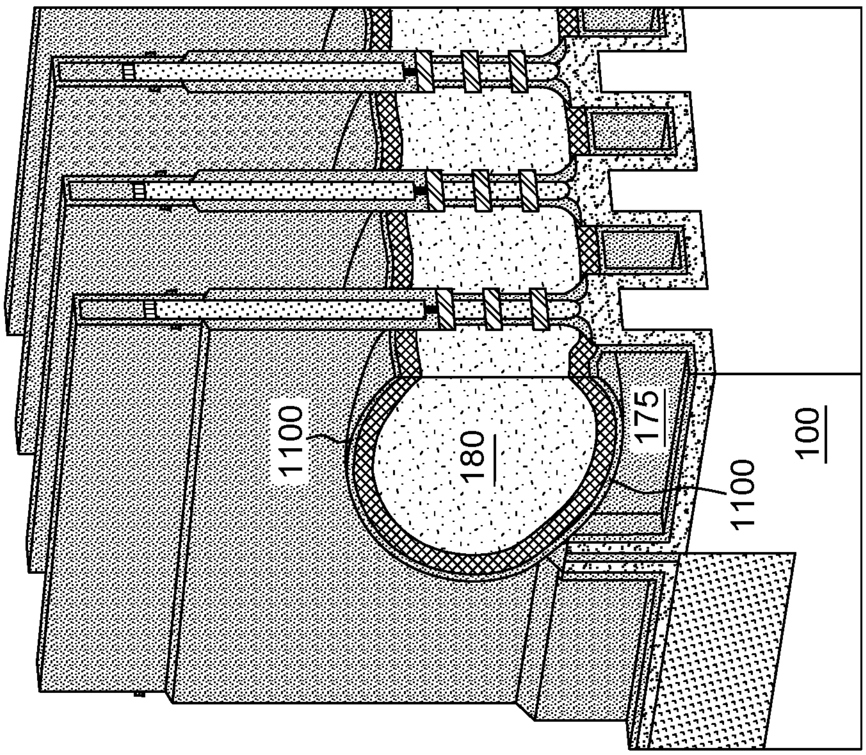

FIGS. 8A, 8B depict forming a conformal liner layer 1100 on at least a portion of an outer surface of wrap-all-around contact 1000 such that conformal liner layer 1100 pinches off gap 190 (see FIG. 7B). Conformal liner layer 1100 may be comprised of, for example, SiBCN, SiNC or SiN. In the case of the first embodiment of the disclosure, as depicted in FIGS. 8A, 8B, cavity 170 (see FIGS. 7A, 7B) is an air gap 175 that has been encapsulated by conformal liner layer 1100. This air gap 175 provides for bottom isolation of S/D epitaxy structure 180 from the substrate. Such bottom isolation can reduce parasitic S/D leakage to substrate 100.

A step-by-step depiction of producing a second embodiment of the disclosure is illustrated in FIGS. 9A, 9B through FIGS. 21A, 21B. Cross-gate views are the "A" portion (left) and cross-fin views are the "B" portion (right) of each Figure and are shown for ease of comprehension.

Figure 9B:
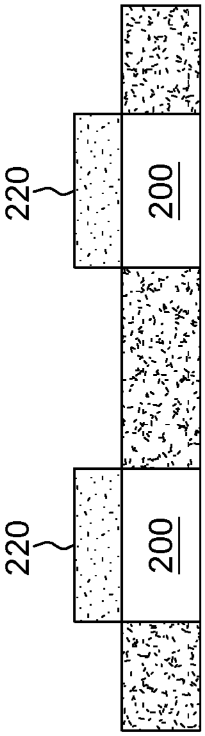
Figure 9A:
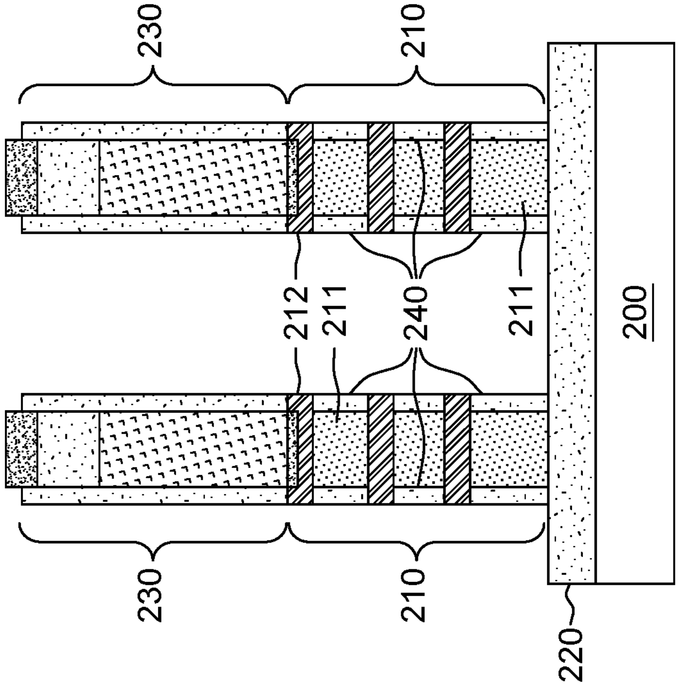

FIGS. 9A, 9B depict a partial FET structure including a substrate 200 and at least two nanosheet stacks 210, each nanosheet stack 210 being formed over substrate 200. Each nanosheet stack 210 includes alternating sheets of SiGe 211 and Si 212. Substrate 200 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 200 and nanosheet stacks 210 may be made by any now known or later developed semiconductor processing, e.g., material deposition, photolithographic patterning, etching, etc., as discussed above in greater detail with respect to the substrate and nanosheet stacks of the first embodiment of the disclosure.

A bottom isolation layer 220 is formed (e.g., by deposition and etch back) on the substrate such that bottom isolation layer 220 is located between substrate 200 and each nanosheet stack 210. Bottom isolation layer 220 may be comprised of, for example, SiBCN, SiNC or SiN. A gate structure 230 is formed over each nanosheet stack 210, e.g., by deposition and patterning.

FIG. 9A also depicts the result of partially indenting (e.g., recessing via etching) SiGe layers 211 of each nanosheet stack 210 and forming inner spacers 240 on edges of indented SiGe layers 211 of each nanosheet stack 210. The inner spacers 240 formation including depositing inner spacer material on bottom isolation layer 220 and edges of nanosheet stacks 210, followed by recessing the inner spacer material. Inner spacers 240 may be comprised of, for example, SiBCN, SiNC or SiN.

Figure 10B:
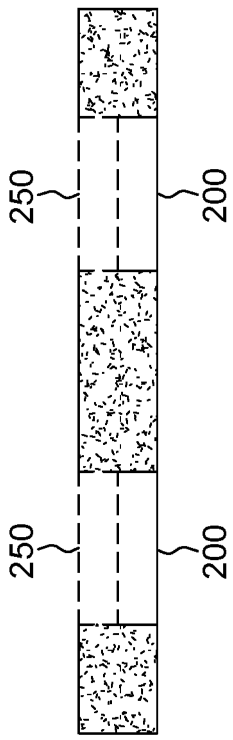
Figure 10A:
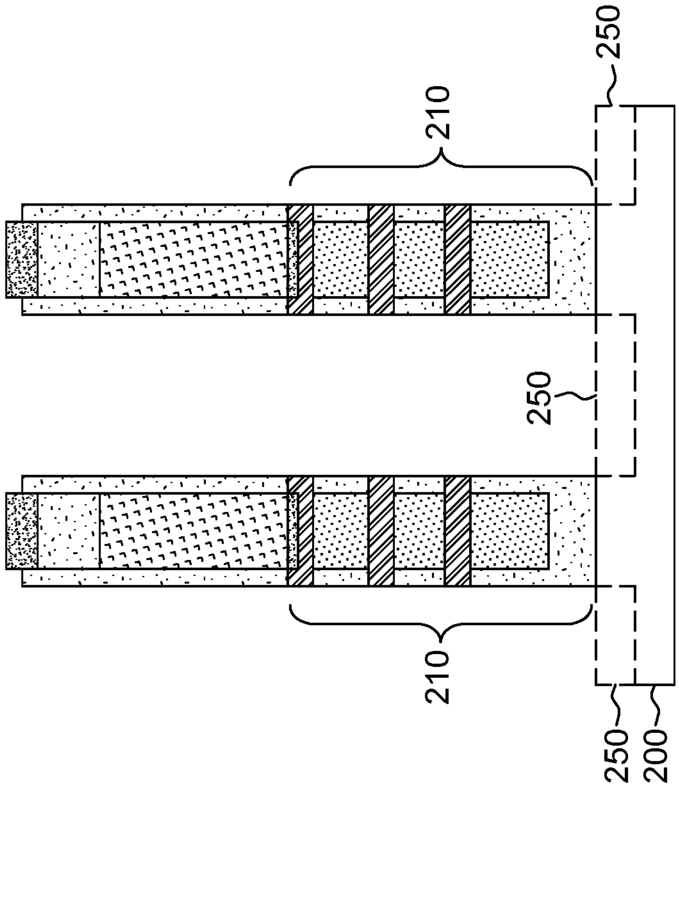

FIGS. 10A, 10B depict directional etching (e.g., RIE) of bottom isolation layer 220 and into substrate 200 (partial substrate recess), thereby creating a substrate recess 250 (see dotted lines) between adjacent nanosheet stacks 210.

Figure 11B:
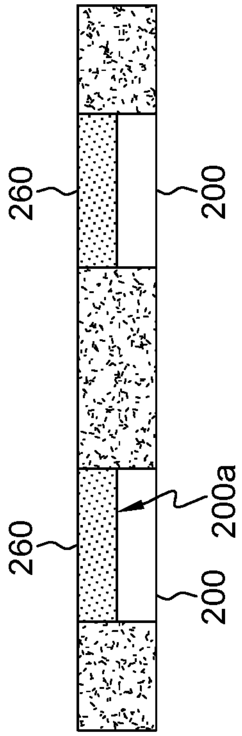
Figure 11A:
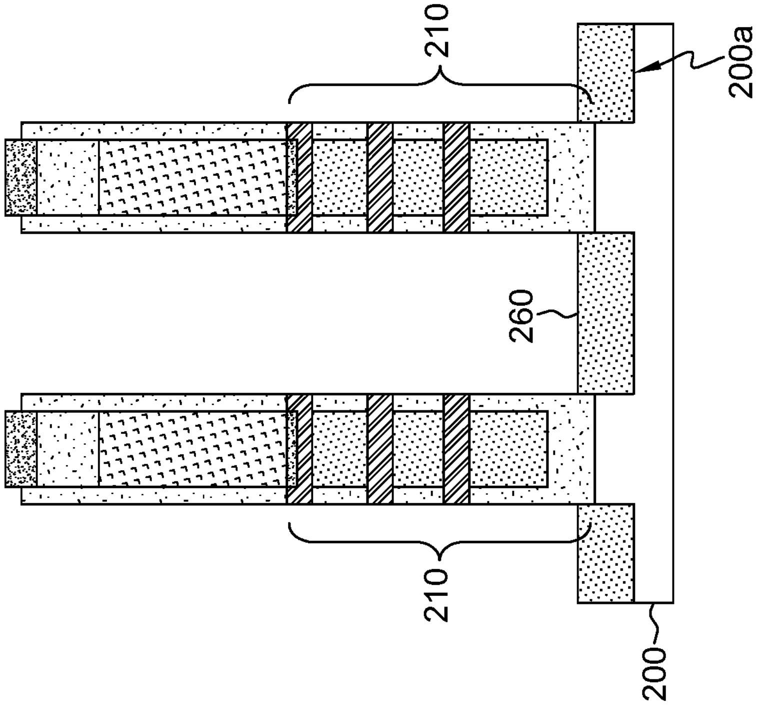

FIGS. 11A, 11B depict epitaxially growing SiGe from a top surface 200*a* of substrate 200 within substrate recess 250 (see FIGS. 10A, 10B), thereby forming a SiGe recess layer 260.

Figure 12A:
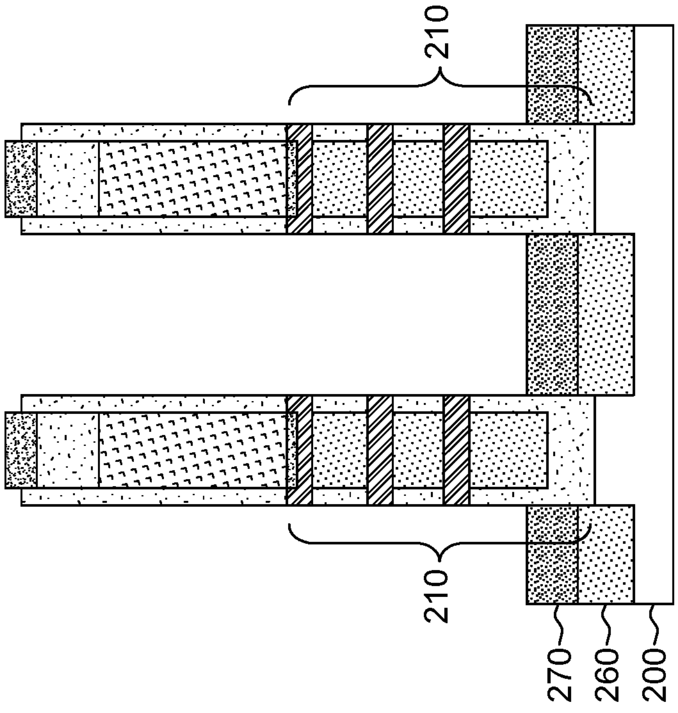
Figure 12B:
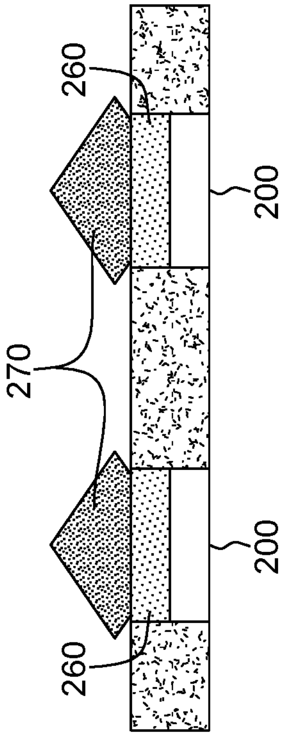

FIGS. 12A, 12B depict forming a sacrificial SiGe layer 270 on SiGe recess layer 260. The forming of sacrificial SiGe layer 270 can be via bottom-dominating epitaxial growth that creates a diamond-like shape as shown in FIG. 12B. The SiGe of sacrificial SiGe layer 270 should have a higher concentration of Ge than that of SiGe recess layer 260.

Figure 13B:
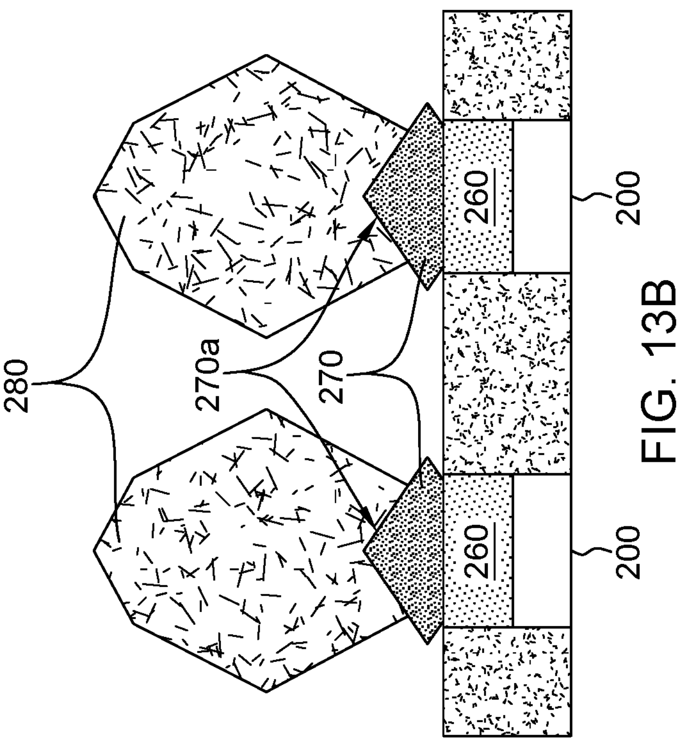
Figure 13A:
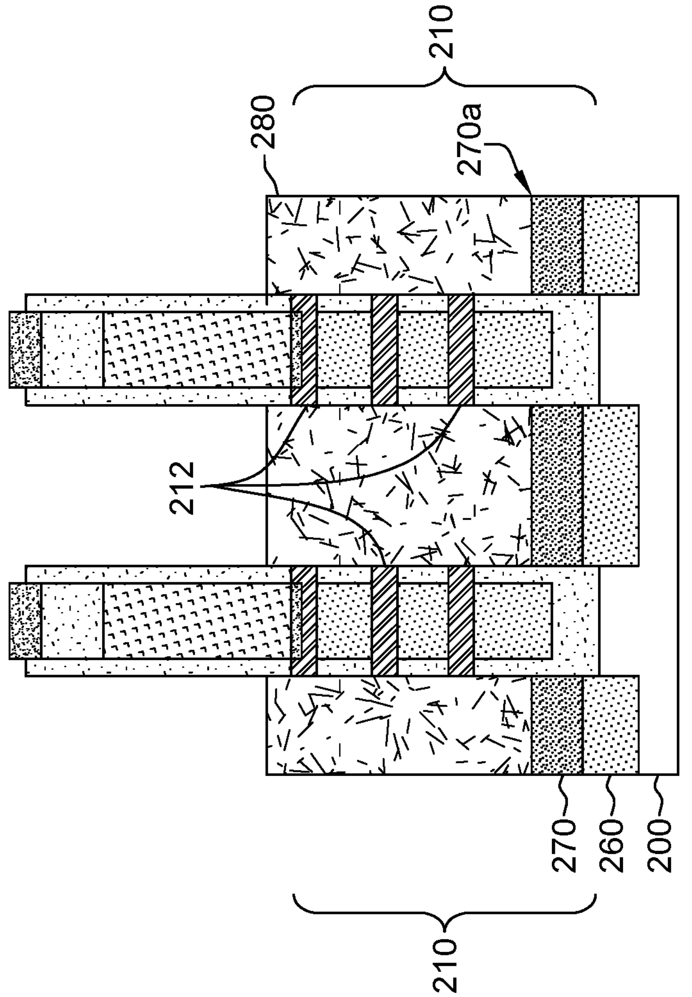

FIGS. 13A, 13B depict the result of epitaxial growth of a S/D epitaxy structure 280 both horizontally between adjacent nanosheet stacks 210 and from edges of Si layers 212 of nanosheet stacks 210 and vertically from a top surface 270*a* of sacrificial SiGe layer 270. It is noted that FIG. 13B depicts S/D epitaxy structure 280 having a semi-hexagonal shape; this is for illustration purposes only. The shape of S/D epitaxy structure 280 may vary depending on desired characteristics.

Figure 14B:
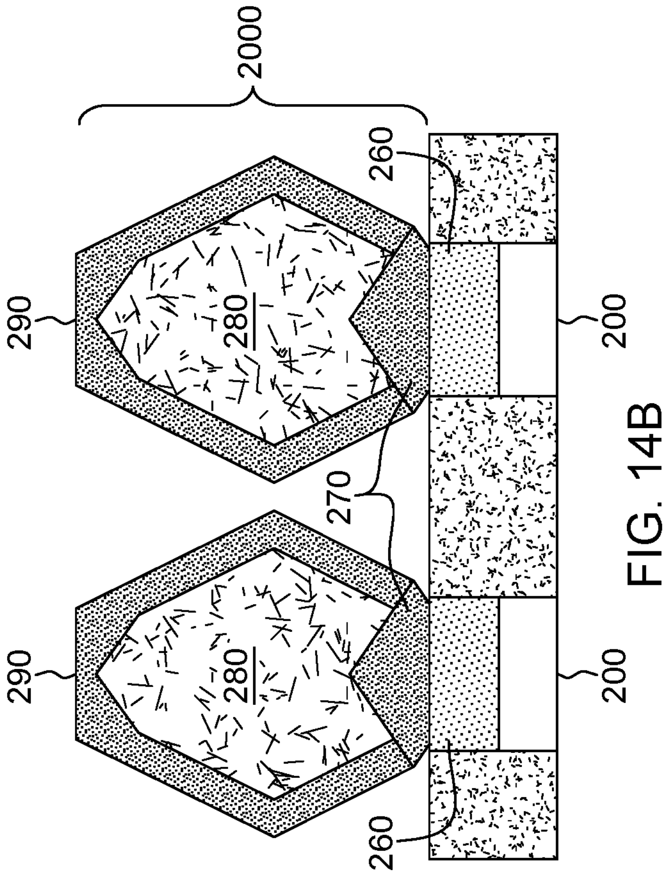
Figure 14A:
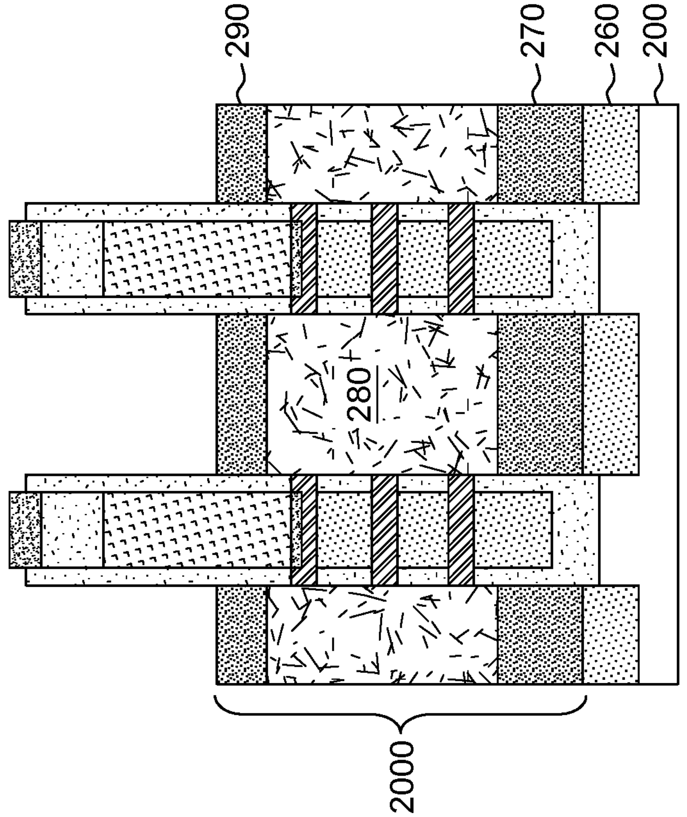

FIGS. 14A, 14B depict the formation of a sacrificial SiGe cap layer 290 around S/D epitaxy structure 280 such that sacrificial SiGe cap layer 290 merges with sacrificial SiGe layer 270 on SiGe recess layer 260. As a result, a sacrificial SiGe-encapsulated S/D structure 2000 is formed. Sacrificial SiGe cap layer 290 may be formed by any now know or later developed deposition technique appropriate to the material being deposited. Prior to depositing sacrificial SiGe cap layer 290, a pre-etch-back may be needed in order to expose sacrificial SiGe layer 270.

Figure 15A:
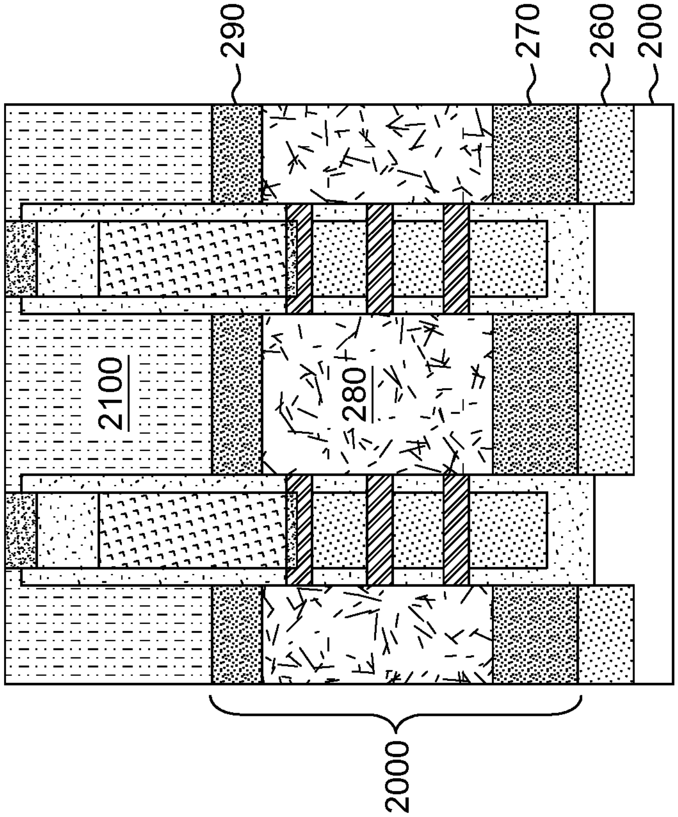
Figure 15B:
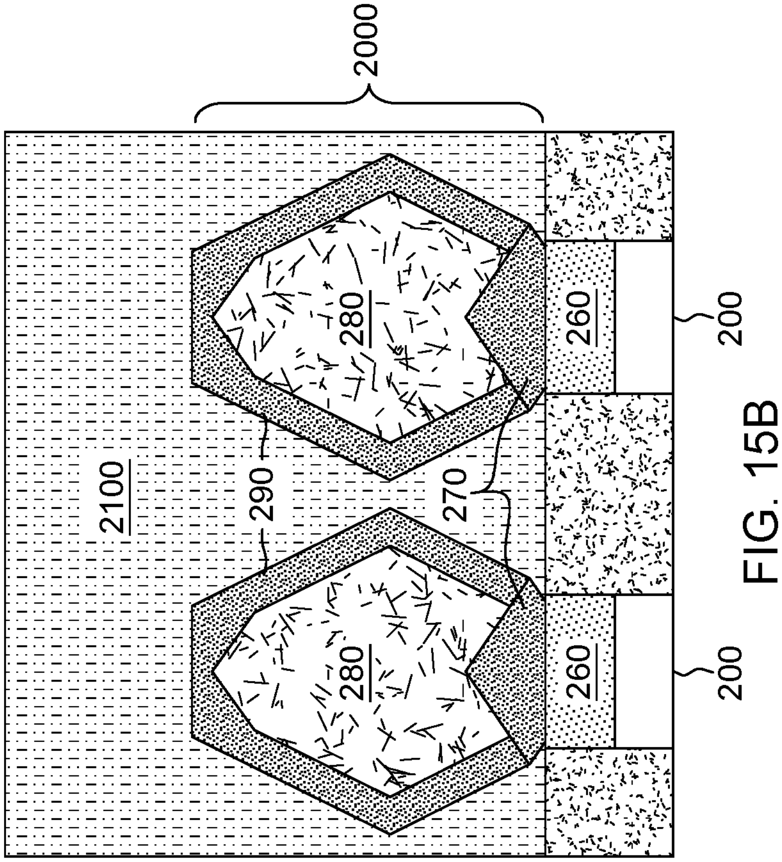

FIGS. 15A, 15B depict the formation of a first dielectric fill 2100 (e.g., by deposition) on and around sacrificial SiGe-encapsulated S/D structure 2000. Any fill 2100 may be used so long as it is insulating (non-conducting), for example, SiN, SiBCN, SiOCN, SiOC, or any combination of low-k materials.

Figure 16B:
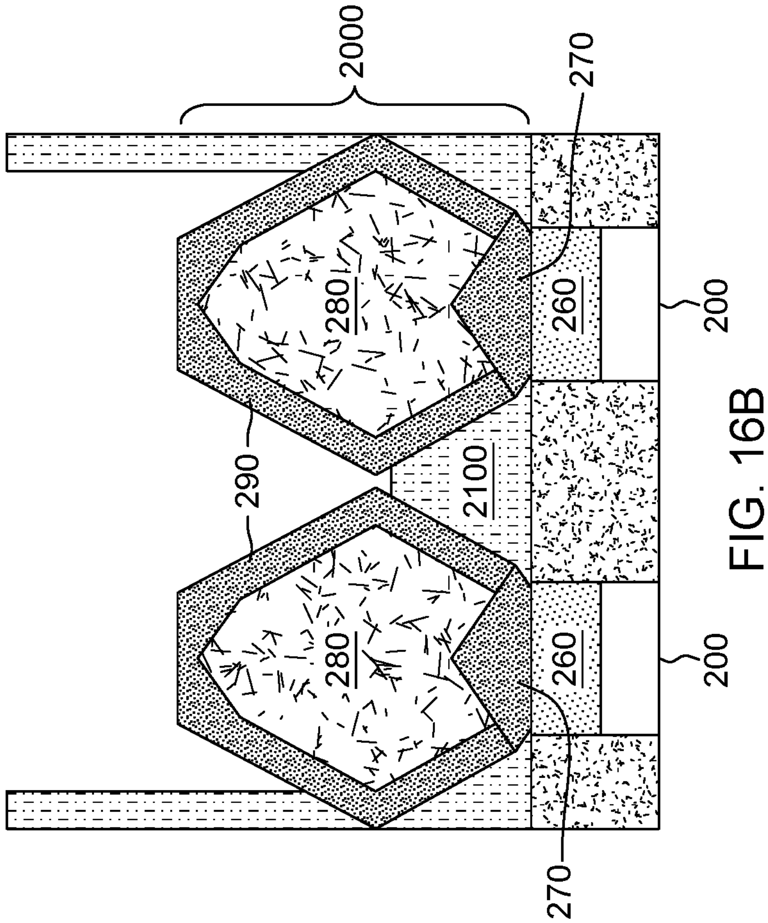
Figure 16A:
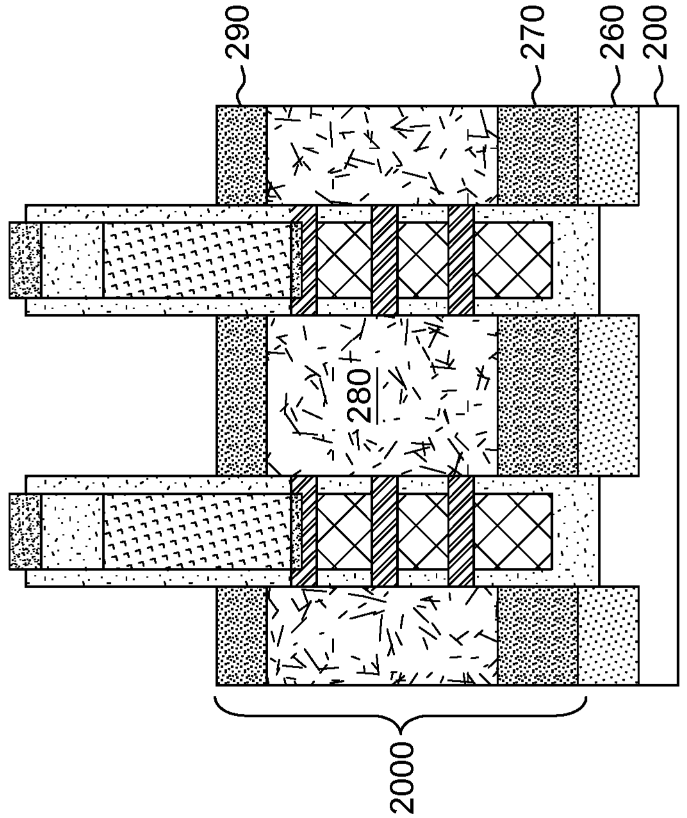

FIGS. 16A, 16B depict removal of a portion of first dielectric fill 2100 such that at least a portion of sacrificial SiGe cap layer 290 is exposed. In the instance of FIG. 16B, the exposed portion is approximately half of sacrificial SiGe-encapsulated S/D structure 2000; however, this portion could be smaller or larger.

Figure 17B:
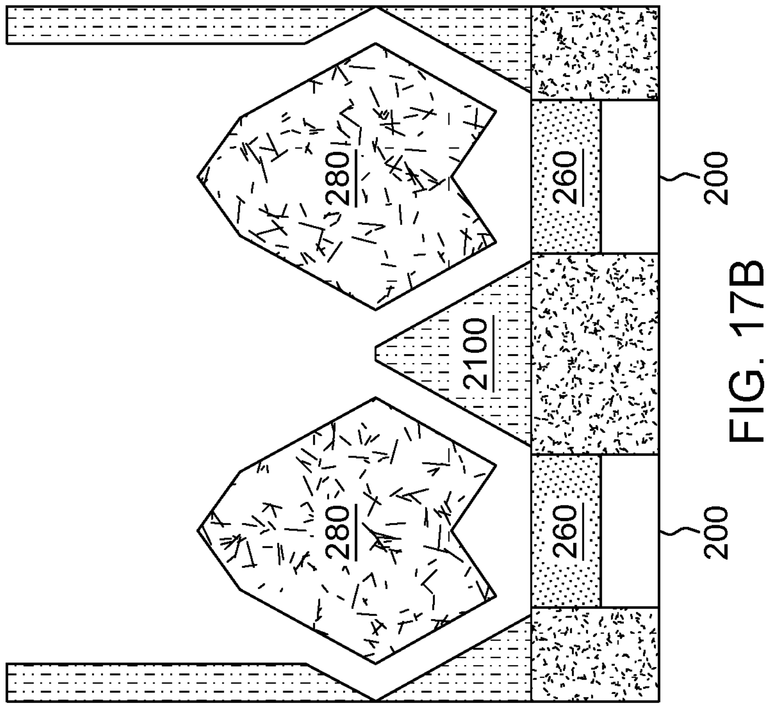
Figure 17A:
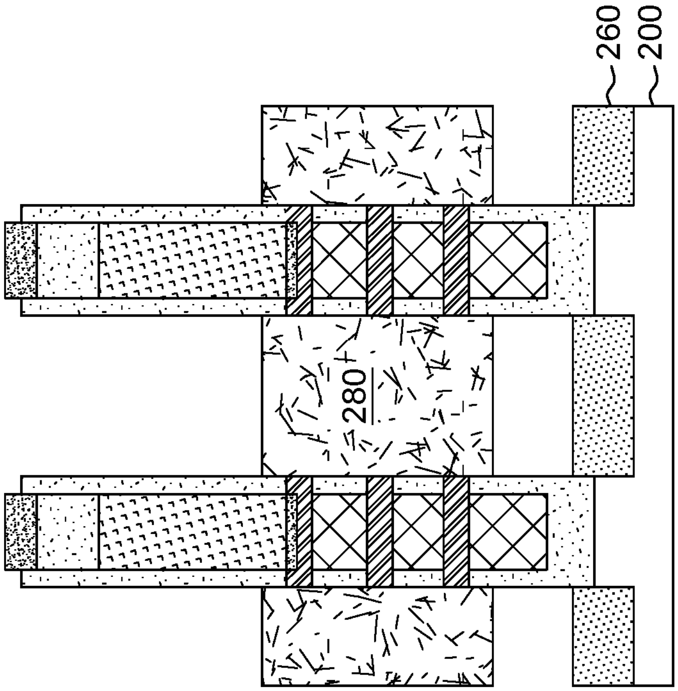

FIGS. 17A, 17B depict removal of sacrificial SiGe layer 270 and sacrificial SiGe cap layer 290 (see FIGS. 16A, 16B) by selective etching. It is noted here that a space exists below S/D epitaxy structure 280 after said removal.

Figure 18B:
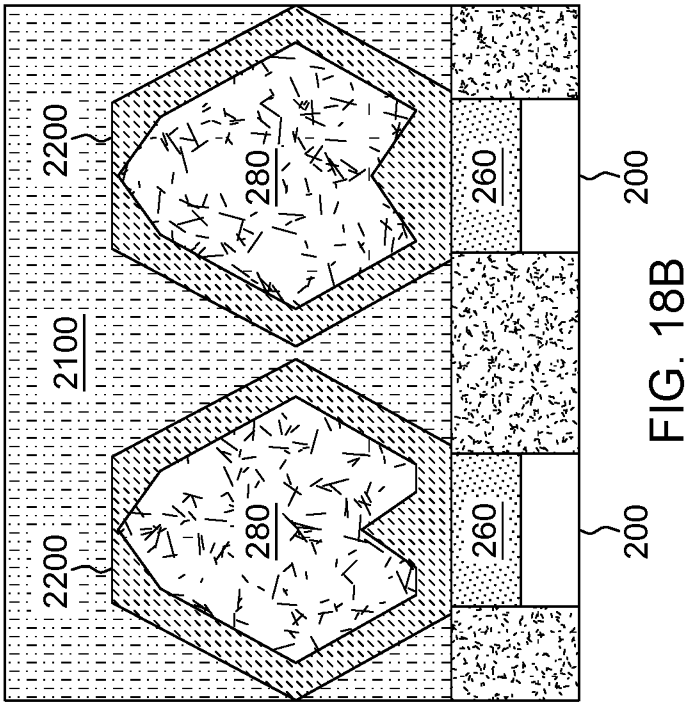
Figure 18A:
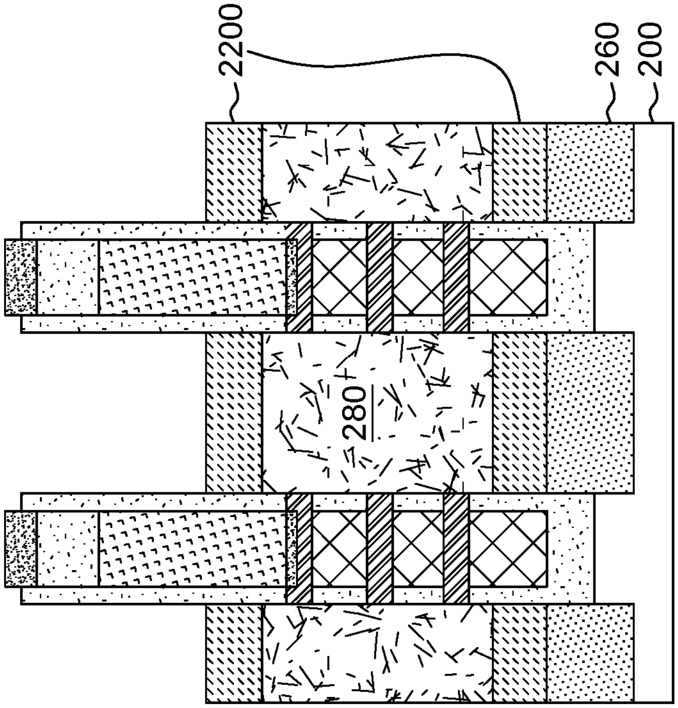

FIGS. 18A, 18B depict forming a partially conformal contact layer 2200 (e.g., by CVD of Ti and silicide) all around S/D epitaxy structure 280, layer 2200 also being referred to as a "wrap-all-around contact." Wrap-all-around contact 2200 provides increased contact interface area by wrapping entirely around S/D epitaxy structure 280 including underneath structure 280 rather than conventional wrap around which does not include underneath the S/D structure. Such increased contact interface area can improve transistor performance. Partially conformal contact layer 2200 may be comprised of, for example, titanium silicide ($TiSi_x$). It is further noted that the space below S/D epitaxy structure 280 shown in FIGS. 17A, 17B no longer exists in FIGS. 18A, 18B since partially conformal contact layer 2200 has filled the space.

Figure 19B:
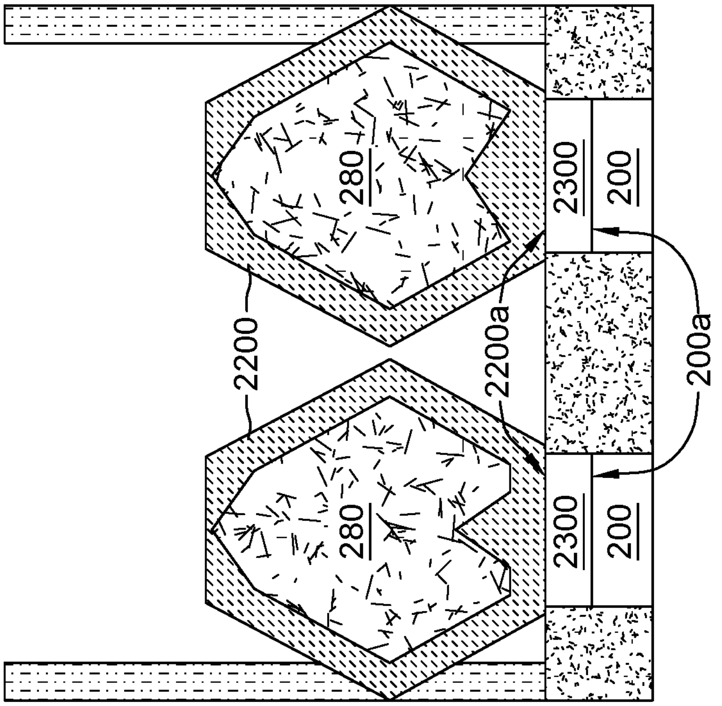
Figure 19A:
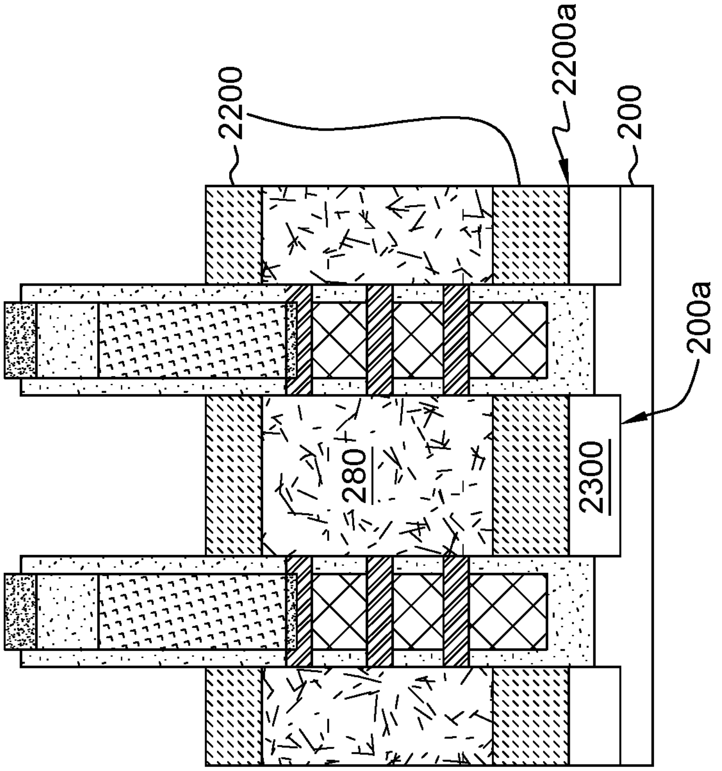

FIGS. 19A, 19B depict removal of remaining portions of first dielectric fill 2100 (see FIG. 18B) as well as removal of SiGe recess layer 260 (see FIGS. 18A, 18B) (e.g., by selective etching). After said removal, and as depicted in FIGS. 19A, 18B, a cavity 2300 exists below wrap-all-around contact 2200 (e.g., between a lower surface 2200*a* of wrap-all-around contact 2200 and upper surface 200*a* of substrate 200).

Figure 20B:
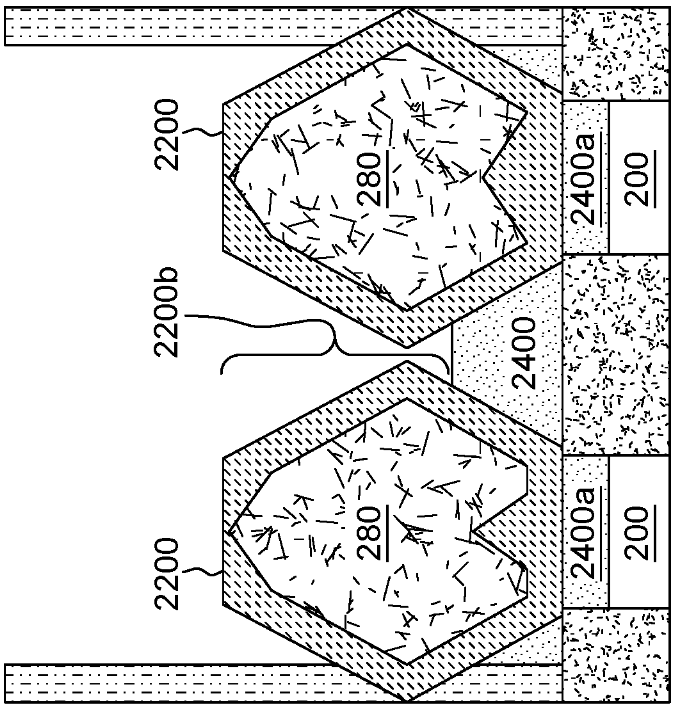
Figure 20A:
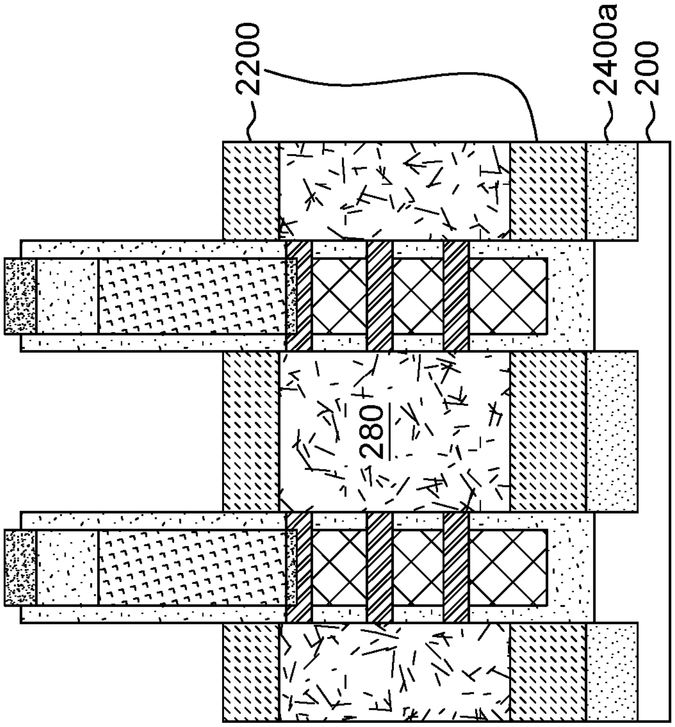

FIGS. 20A, 20B depict the formation of a second dielectric fill 2400 (e.g., by deposition) under and around wrap-all-around contact 2200, and the result of recessing second dielectric fill 2400 to expose an upper portion 2200*b* of wrap-all-around contact 2200. Any fill 2400 may be used so long as it is insulating (non-conducting), for example, SiN, SiBCN, SiOCN, SiOC, or any combination of low-k materials. It is noted here that cavity 2300 (see FIGS. 19A, 19B) has been filled with second dielectric fill 2400 during the formation process. Thus, in the case of the second embodiment of the disclosure, as depicted in FIGS. 20A, 20B (and FIGS. 21A, 21B discussed below), cavity 2300 has become an isolation 2400*a* (i.e., a dielectric filled region). This dielectric filled region referred to as isolation 2400*a* provides for bottom isolation of S/D epitaxy structure 280 from substrate 200. Such bottom isolation can reduce parasitic S/D leakage to substrate 200.

Figure 21B:
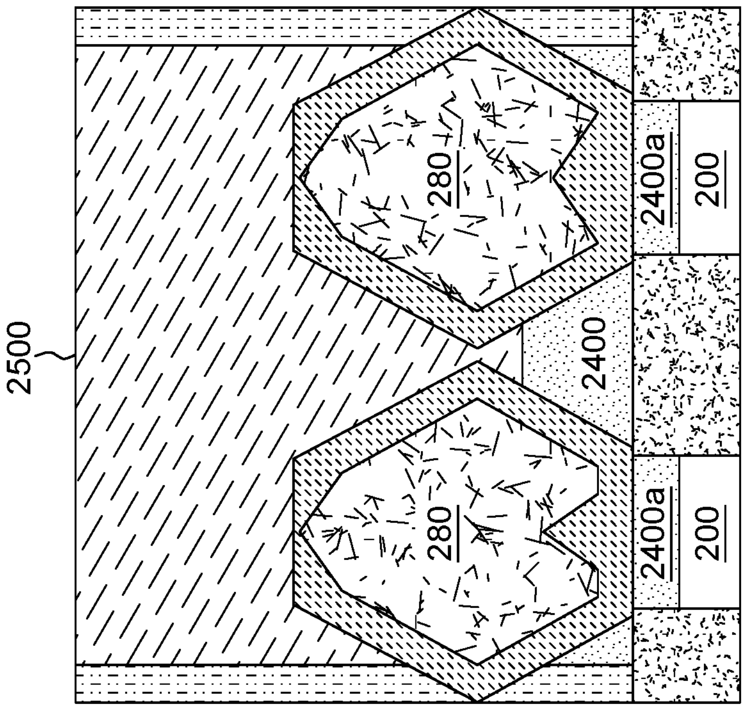
Figure 21A:
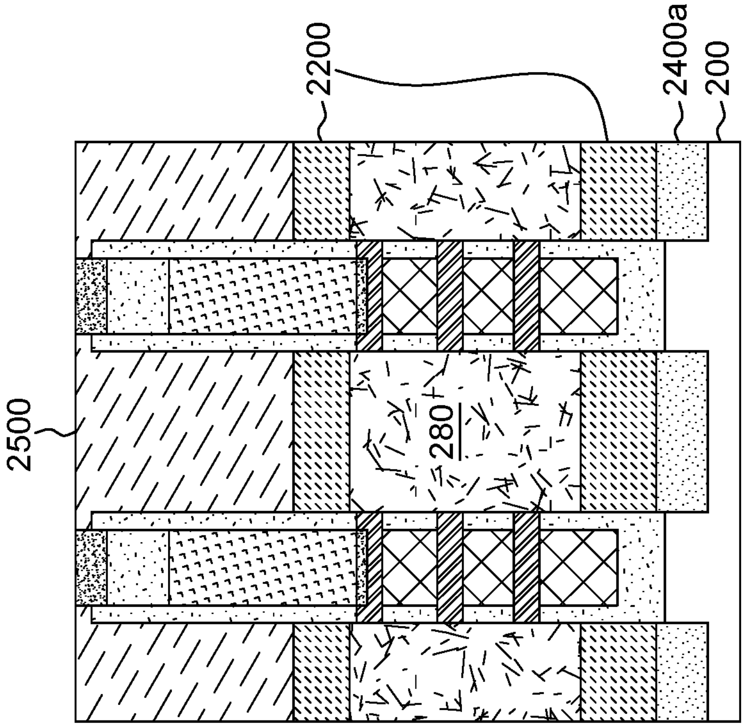

FIGS. 21A, 21B depict the formation of a conductive contact 2500 on the exposed portion 2200*b* of wrap-all-around contact 2200 from FIG. 20B. Conductive contact 2500 may comprise any conductive material, including metal, suitable for a transistor contact, for example, doped polysilicon, W, Co and Ru. Any necessary liner material (not shown) may also be provided, e.g., a refractory metal liner. Conductive contact 2500 may be formed by depositing the conductive material followed by planarizing.

A step-by-step depiction of producing a third embodiment of the disclosure is illustrated in FIGS. 22A, 22B through FIGS. 31A, 31B. Cross-gate views are the "A" portion (left) and cross-fin views are the "B" portion (right) of each Figure and are shown for ease of comprehension.

Figure 22A:
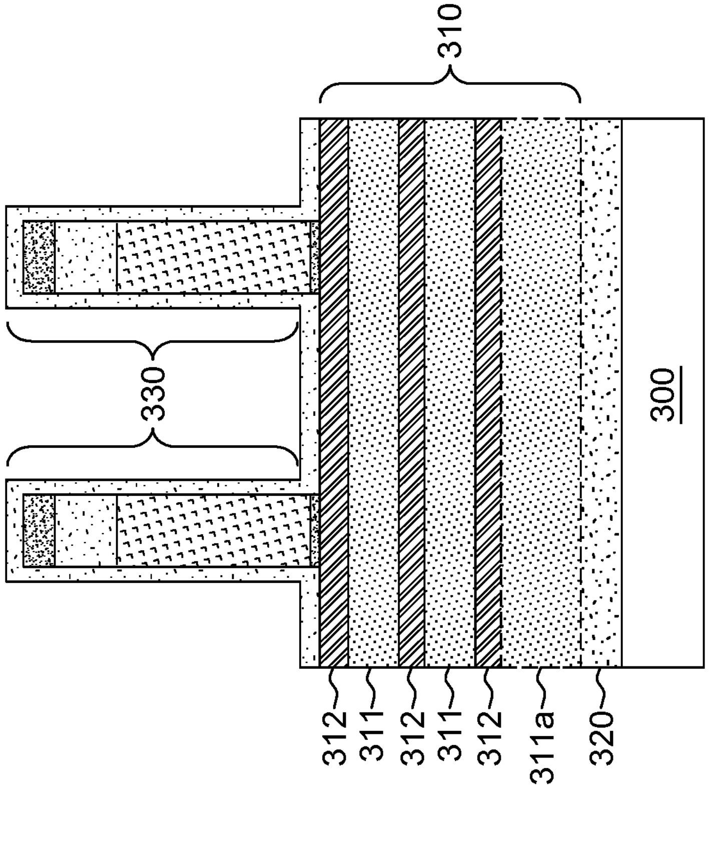
Figure 22B:
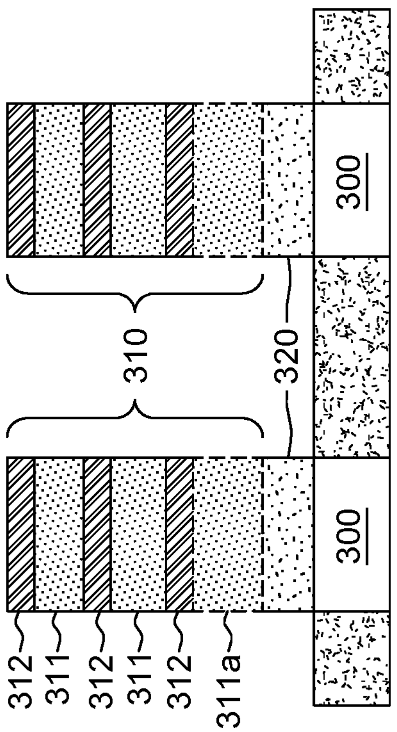

FIGS. 22A, 22B depict a partial FET structure including a substrate 300 and at least two nanosheet stacks 310, each nanosheet stack 310 being formed over substrate 300. Each nanosheet stack 310 includes alternating sheets of SiGe 311 and Si 312. Nanosheet stacks 310 of the third embodiment differ from nanosheet stacks 110 and 210 of the first and second embodiments, respectively, in that a bottom-most SiGe layer 311*a* of nanosheet stacks 310 (surrounded by dotted line) is thicker than other SiGe layers 311 of nanosheet stacks 310.

Substrate 300 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 300 and nanosheet stacks 310 may be made by any now known or later developed semiconductor processing, e.g., material deposition, photolithographic patterning, etching, etc., as discussed above in greater detail with respect to the substrate and nanosheet stacks of the first embodiment of the disclosure.

A bottom isolation layer 320 is formed (e.g., by deposition) on substrate 300 such that bottom isolation layer 320 is located between substrate 300 and each nanosheet stack 310. Bottom isolation layer 320 may be comprised of, for example, SiBCN, SiNC or SiN. A conventional gate structure 330 is formed over each nanosheet stack 310.

Figure 23B:
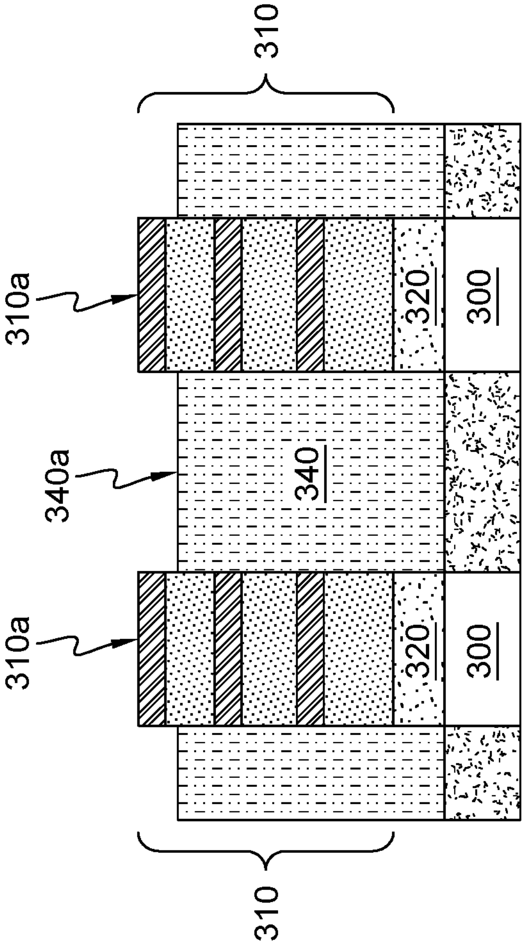
Figure 23A:
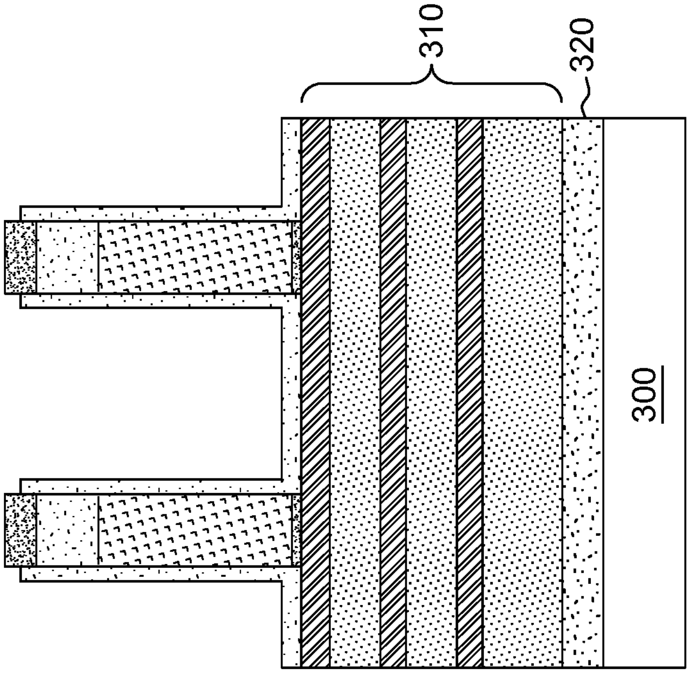

FIGS. 23A, 23B depict the formation of an oxide layer 340 (e.g., by deposition) between adjacent nanosheet stacks 310 such that a top surface 340*a* of oxide layer 340 is below a top level 310*a* of nanosheet stacks 310. The formation of oxide layer 340 can be via deposition followed by etching back to desired level/height. Oxide layer 340 may comprise any suitable isolative oxide material, for example, SiCO, $SiO_2$ and SiNOC.

Figure 24A:
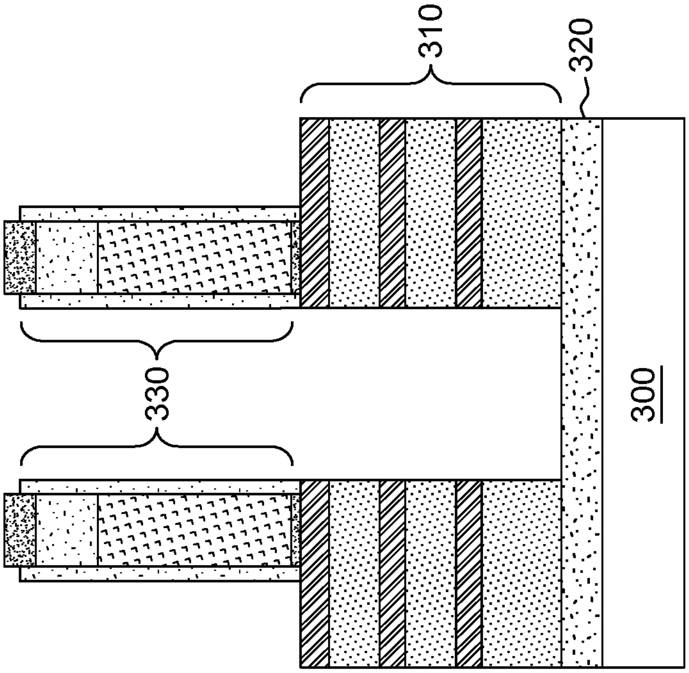
Figure 24B:
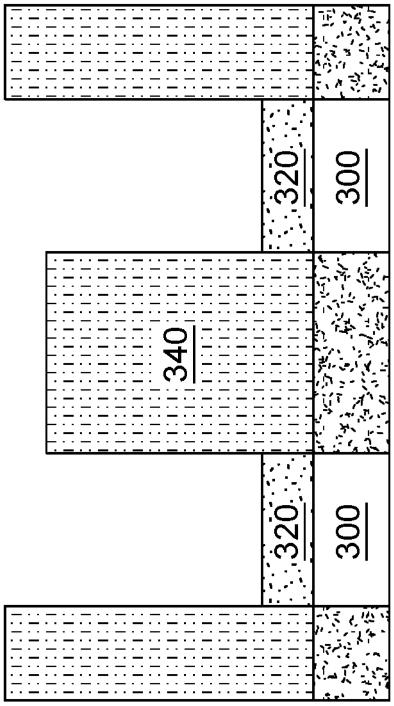

FIGS. 24A, 24B depict removal (e.g., by etching) of any portions of nanosheet stacks 310 remaining between two given adjacent gate structures 330 (see also FIG. 23B). The distance between two adjacent gate structures 330 can be approximately 20 nanometers (nm) (see arrow).

Figure 25B:
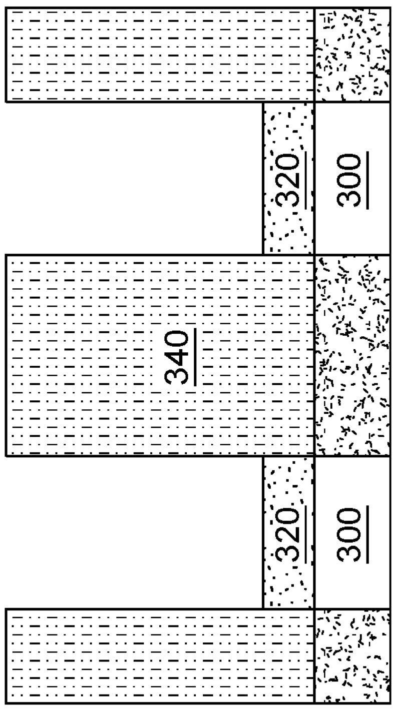
Figure 25A:
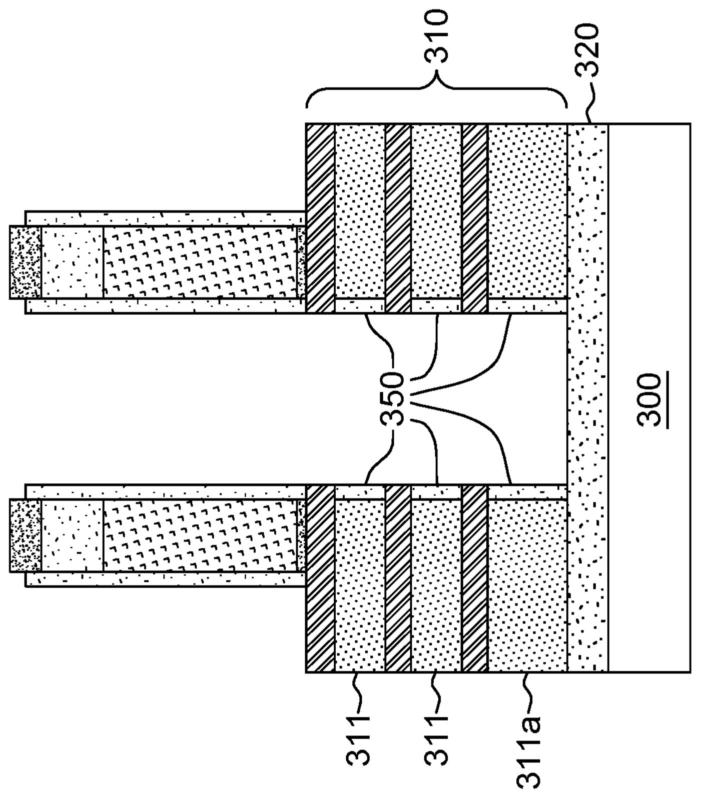

FIGS. 25A, 25B depict the results of partially indenting (e.g., by etching) SiGe layers 311 of nanosheet stacks 310 and then forming inner spacers 350 (e.g., by deposition) within the indentations of SiGe layers 311 of nanosheet stacks 310. Inner spacers 350 may be comprised of, for example, SiBCN, SiNC or SiN.

Figure 26B:
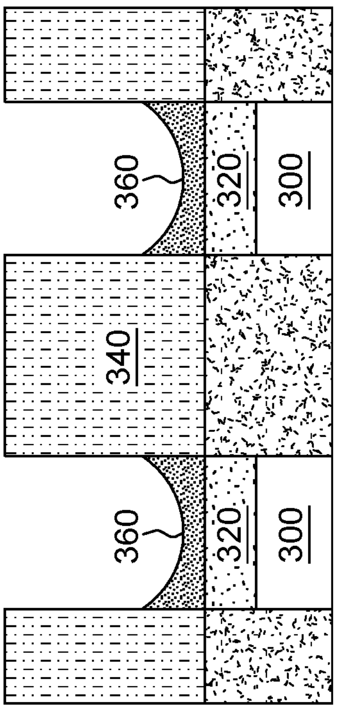
Figure 26A:
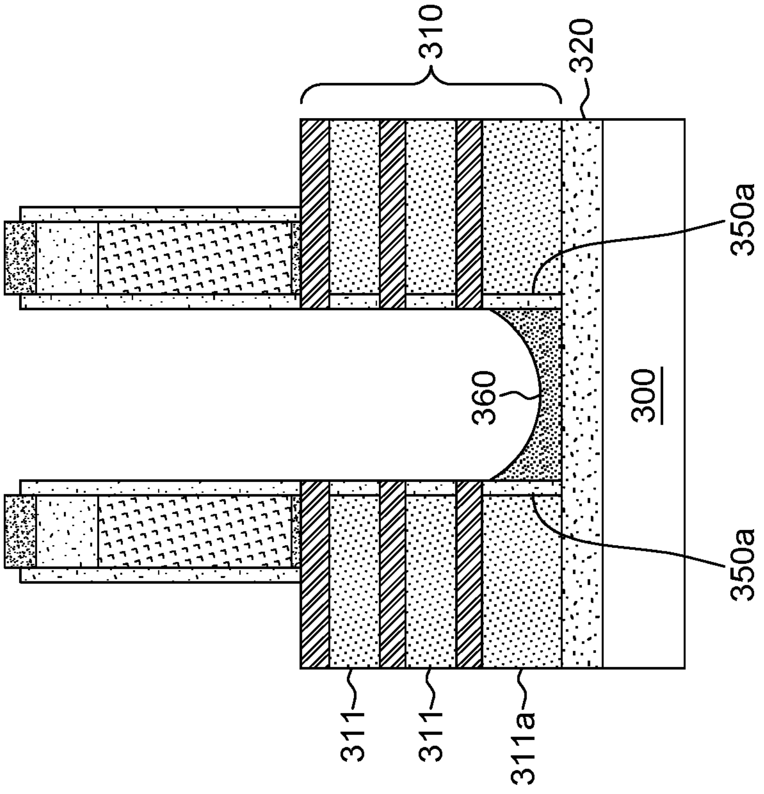

FIGS. 26A, 26B depict the formation of a bottom sacrificial SiGe layer 360 (e.g., by epitaxial growth) on bottom isolation layer 320 and on bottom-most inner spacers 350*a*. Bottom sacrificial SiGe layer 360 preferably has a higher Ge content than SiGe layers 311 of nanosheet stacks 310.

Figure 27B:
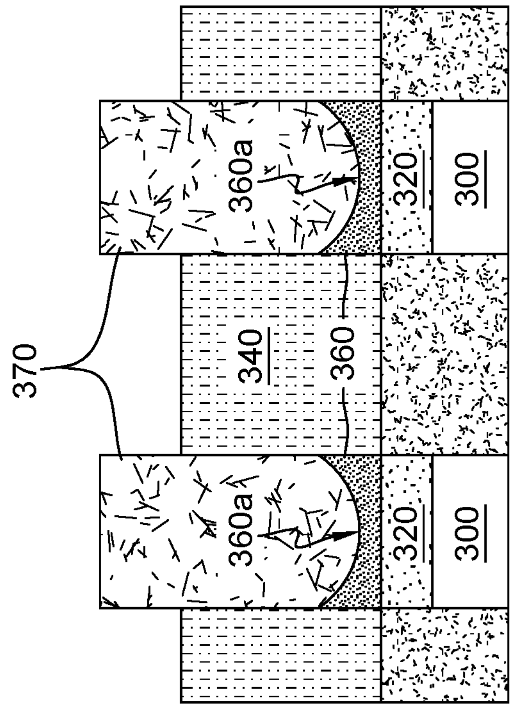
Figure 27A:
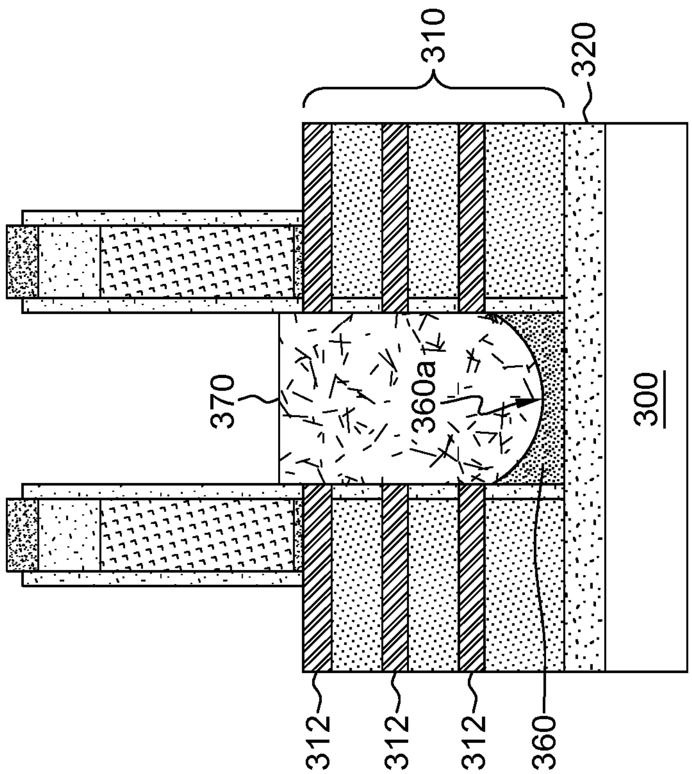

FIGS. 27A, 27B depicts the result of epitaxial growth of a S/D epitaxy structure 370 both horizontally between adjacent nanosheet stacks 310 and from edges of Si layers 312 of nanosheet stacks 310 and vertically from a top surface 360*a* of bottom sacrificial SiGe layer 360. It is noted that FIGS. 27A, 27B depict S/D epitaxy structure 370 having a certain shape (rectangular with a rounded edge); this is for illustration purposes only. The shape of S/D epitaxy structure 370 may vary depending on desired characteristics.

Figure 28B:
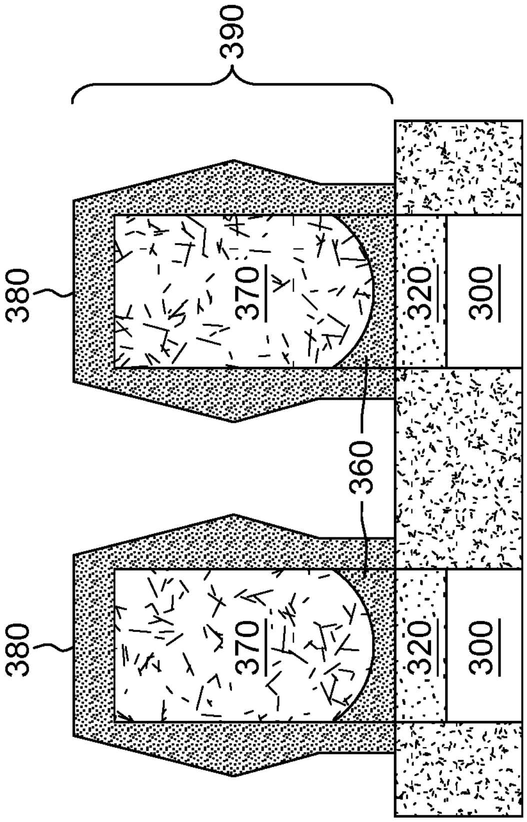
Figure 28A:
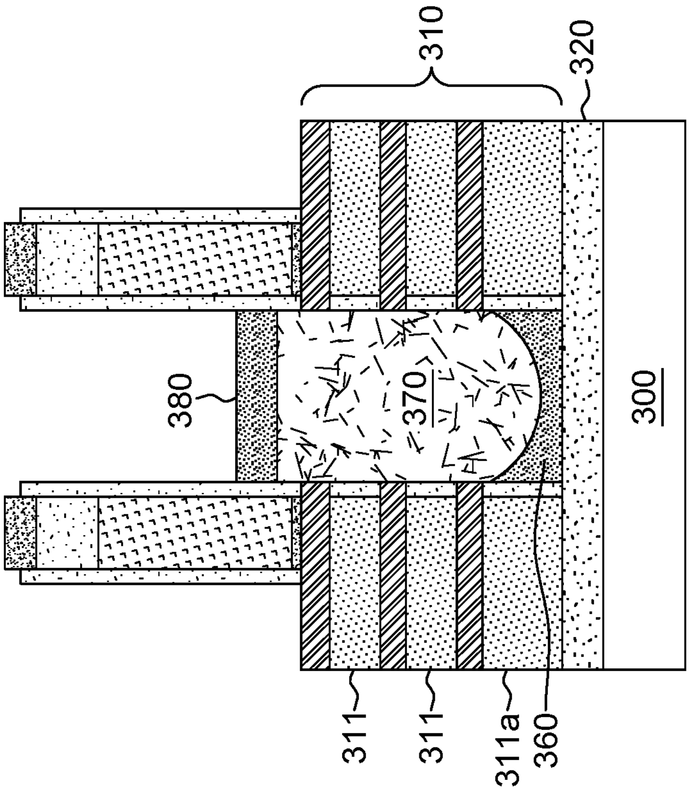

FIGS. 28A, 28B depict removing (e.g., by selective etching) oxide layer 340 (see FIG. 27B) and forming a sacrificial SiGe cap layer 380 (e.g., by epitaxial growth) around S/D epitaxy structure 370 such that sacrificial SiGe cap layer 380 merges with bottom sacrificial SiGe layer 360, thereby forming a sacrificial SiGe-encapsulated S/D structure 390. Sacrificial SiGe cap layer 380 preferably has a higher Ge content than SiGe layers 311 of nanosheet stacks 310, similar to the higher Ge content of bottom sacrificial SiGe layer 360.

Figure 29B:
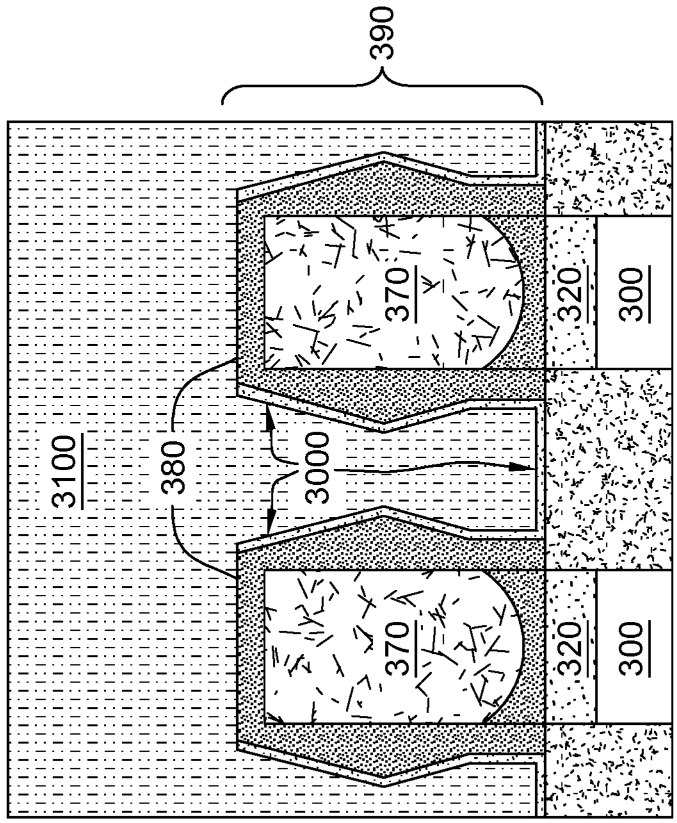
Figure 29A:
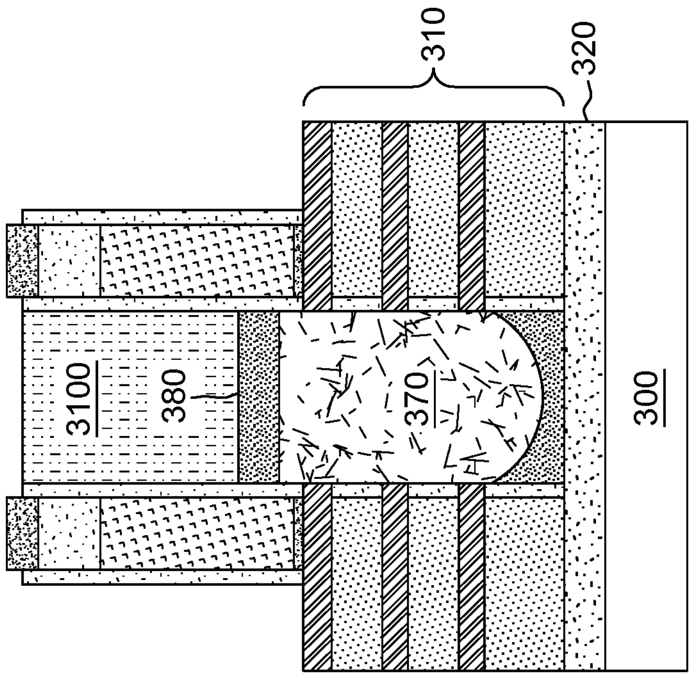

FIGS. 29A, 29B depict forming a conformal liner layer 3000 (e.g., by deposition) on exposed surfaces of sacrificial SiGe-encapsulated S/D structure 390, followed by forming a dielectric fill 3100 (e.g., by deposition and etch back) on conformal liner layer 3000. Conformal liner layer 3000 may be comprised of, for example, SiBCN, SiNC or SiN. Any fill 3100 may be used so long as it is insulating (non-conducting), for example, SiN, SiBCN, SiOCN, SiOC, or any combination of low-k materials.

Figure 30A:
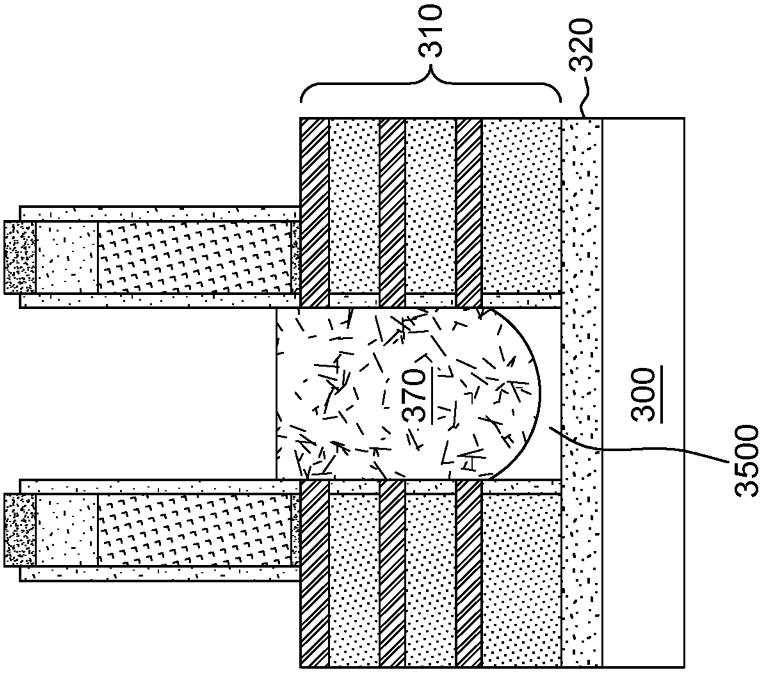
Figure 30B:
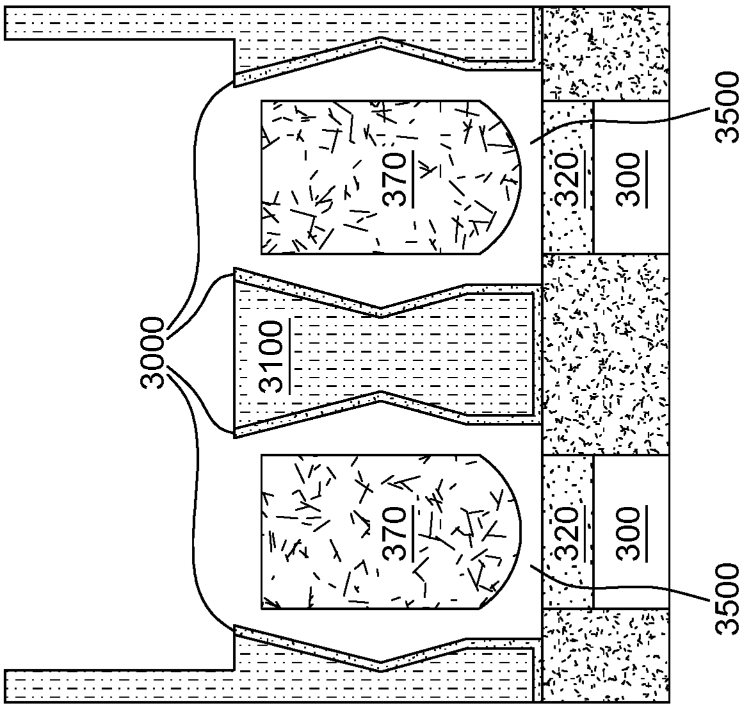

FIGS. 30A, 30B depict the result of removing a portion of dielectric fill 3100 and a corresponding portion of conformal liner layer 3000 (see also FIG. 29B) such that at least a top portion of sacrificial SiGe cap layer 380 is exposed (see FIGS. 29A, 29B), followed by removing all sacrificial SiGe encapsulating the S/D structure 370, in other words removing sacrificial SiGe 360 and 380 (see FIG. 28B). It is noted here that a space 3500 exists below S/D epitaxy structure 370 after said removal.

Figure 31B:
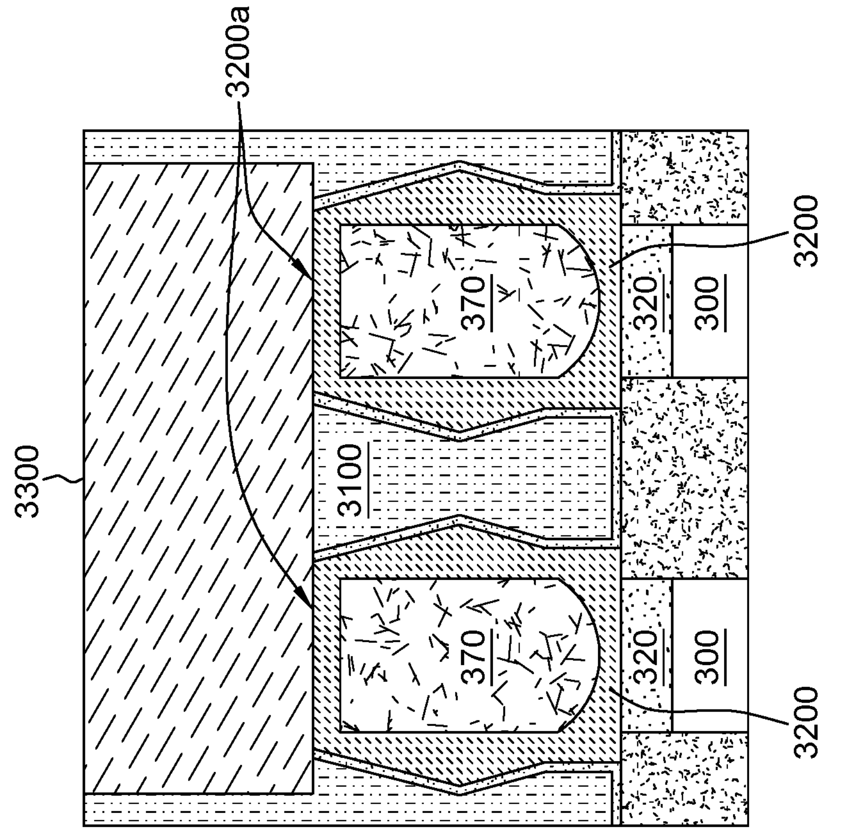
Figure 31A:
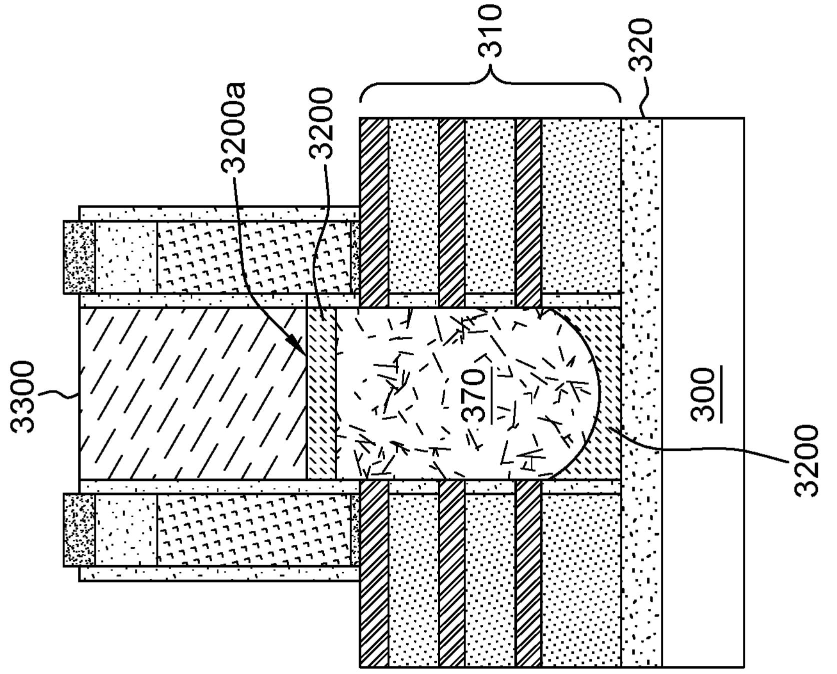

FIGS. 31A, 31B depict forming a partially conformal contact layer 3200 (e.g., by CVD of Ti and silicide) all around S/D epitaxy structure 370, layer 3200 also being referred to as a "wrap-all-around contact." Wrap-all-around contact 3200 provides increased contact interface area by wrapping entirely around S/D epitaxy structure 370 including underneath structure 370 as opposed to conventional wrap around contacts that do not wrap underneath the S/D structure. Such increased contact interface area can improve transistor performance. Partially conformal contact layer 3200 may be comprised of, for example, titanium silicide ($TiSi_x$). It is further noted that the space 3500 below S/D epitaxy structure 370 shown in FIGS. 30A, 30B no longer exists in FIGS. 31A, 31B since partially conformal contact layer 3200 has filled the space.

FIGS. 31A, 31B also depict formation of a conductive contact 3300 on a top surface 3200*a* of wrap-all-around contact 3200. Conductive contact 3300 may comprise any conductive material, including metal, suitable for a transistor contact, for example, doped polysilicon, W, Co and Ru. Any necessary liner material (not shown) may also be provided, e.g., a refractory metal liner. Conductive contact 3300 may be formed by depositing the conductive material followed by planarizing.

In the case of the third embodiment of the disclosure, as depicted in FIGS. 31A, 31B, at least a portion of bottom isolation layer 320 remains present below wrap-all-around contact 3200 and above substrate 300. This bottom isolation layer 320 provides for bottom isolation of S/D epitaxy structure 370 from substrate 300. Such bottom isolation can reduce parasitic S/D leakage to substrate 300.

A step-by-step depiction of producing a fourth embodiment of the disclosure is illustrated in FIGS. 32A, 32B through FIGS. 42A, 42B. Cross-gate views are the "A" portion (left) and cross-fin views are the "B" portion (right) of each Figure and are shown for ease of comprehension.

Figure 32B:
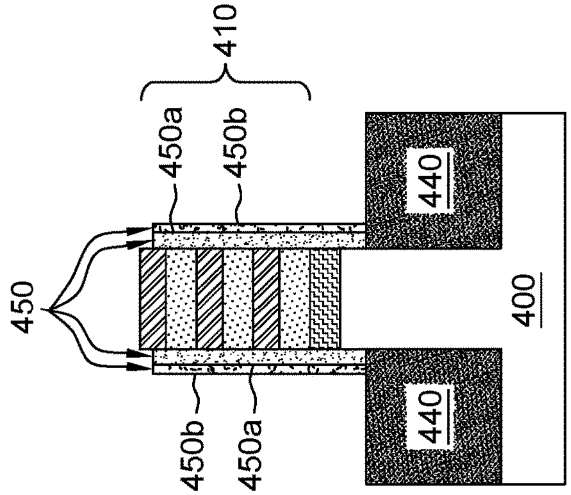
Figure 32A:
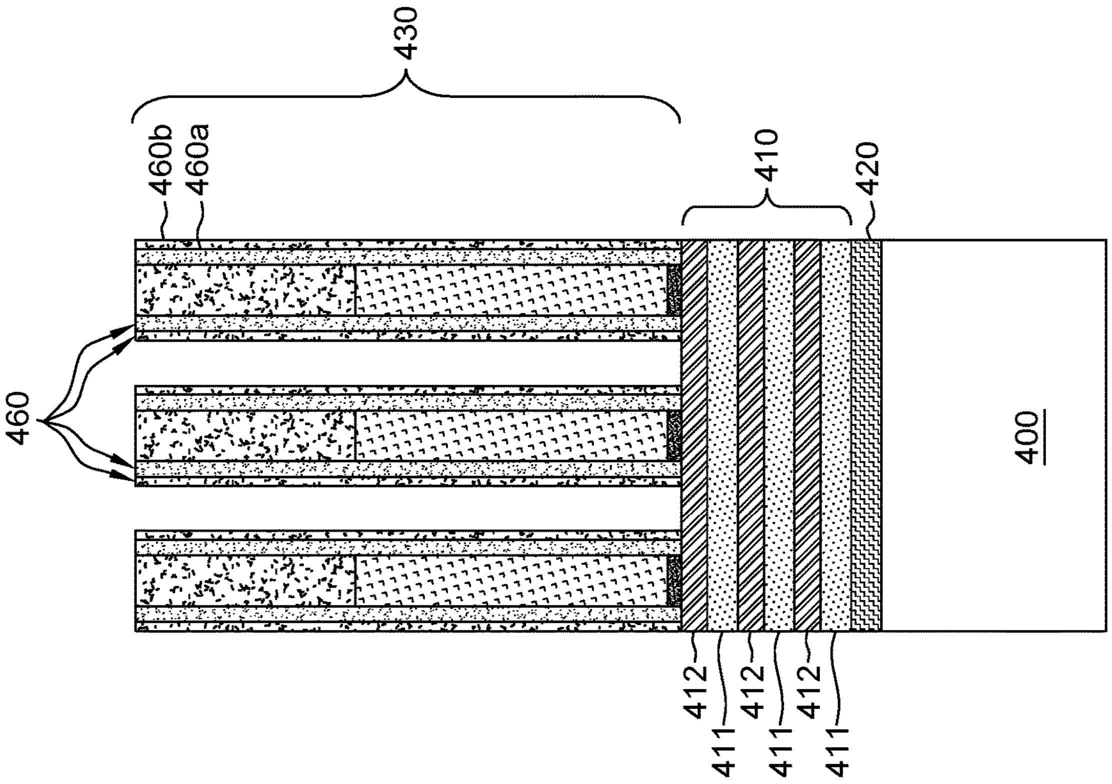

FIGS. 32A, 32B depicts a partial FET structure including a substrate 400 and at least two nanosheet stacks 410, each nanosheet stack 410 being formed over substrate 400. Each nanosheet stack 410 includes alternating sheets of SiGe 411 and Si 412. Substrate 400 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 400 and nanosheet stacks 410 may be made by any now known or later developed semiconductor processing, e.g., material deposition, photolithographic patterning, etching, etc., as discussed above in greater detail with respect to the substrate and nanosheet stacks of the first embodiment of the disclosure.

A first sacrificial SiGe layer 420 is formed (e.g., by epitaxial growth) on substrate 400 such that first sacrificial SiGe layer 420 is located between substrate 400 and each nanosheet stack 410. First sacrificial SiGe layer 420 preferably has a higher Ge content than SiGe layers 411 of nanosheet stacks 410. A conventional gate structure 430 is formed over each nanosheet stack 410.

FIGS. 32A, 32B also depict forming a shallow trench isolation (STI) 440 between adjacent nanosheet stacks 410 and adjacent gate structures 430, as well as forming a multi-layer stack spacer 450 on edges of nanosheet stacks 410, and forming a multi-layer gate spacer 460 on sidewalls of gate structure 430, the multi-layer gate spacer 460 including at least a gate-side layer 460*a* in contact with gate 430 and a spacer-side layer 460*b* in contact with a layer of multi-layer gate spacer 460. STI 440 may be any suitable trench isolation material, for example, $SiO_2$. Gate-side layer 460*a* may comprise SiCO or SiOCN. Spacer-side layer 460*b* may comprise SiN.

Figure 33B:
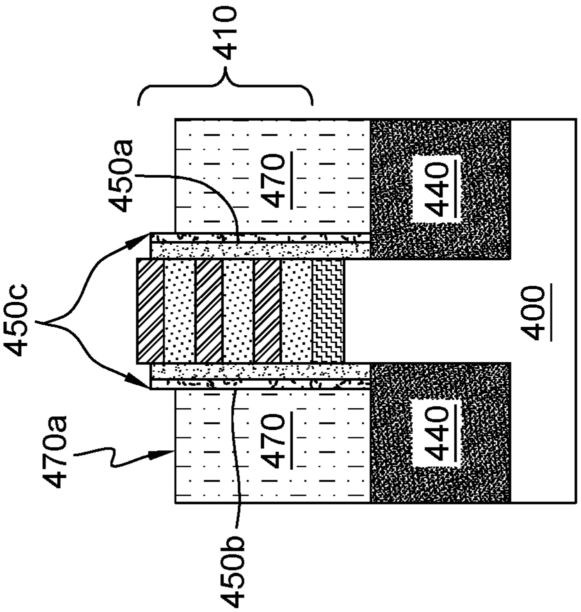
Figure 33A:
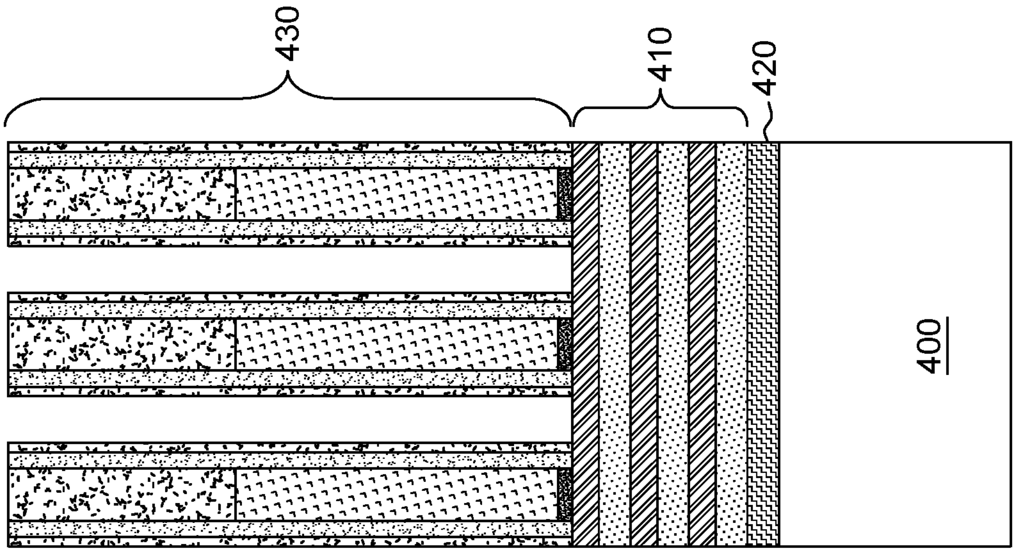

FIGS. 33A, 33B depict formation of an organic planarization layer (OPL) 470 (e.g. by deposition and planarization) on STI 440 and on multi-layer stack spacer 450, multi-layer stack spacer 450 including at least an inner layer 450*a* in contact with the edges of nanosheet stacks 410 and an outer layer 450*b* in contact with OPL 470 (see also FIG. 32B for layers 450*a* and 450*b*). Inner layer 450*a* may comprise SiCO or SiOCN. Outer layer 450*b* may comprise SiN. FIG. 33B also depicts the result of recessing a top surface 470*a* of OPL 470 to a level below a top surface 450*c* of multi-layer stack spacer 450 made up of layers 450*a* and 450*b*.

Figure 34B:
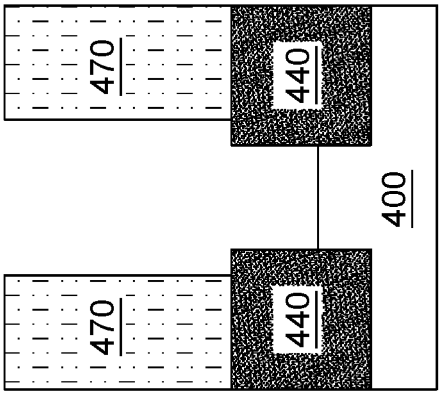
Figure 34A:
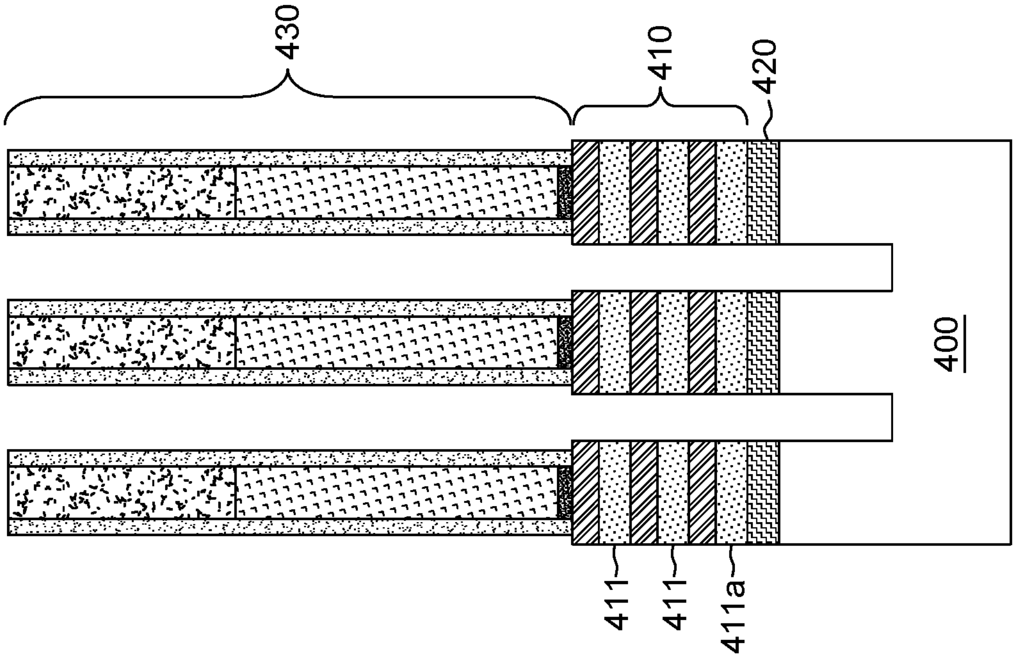

FIGS. 34A, 34B depict the result of removing nanosheet stacks 410 and recessing substrate 400 between adjacent inner layers 450*a* of multi-layer stack spacers 450, as well as removing inner layers 450*a* of multi-layer stack spacers 450, and removing outer layers 450*b* of multi-layer stack spacers 450 and spacer-side layers 460*b* of multi-layer gate spacers 460 (see FIGS. 33A, 33B).

Figure 35B:
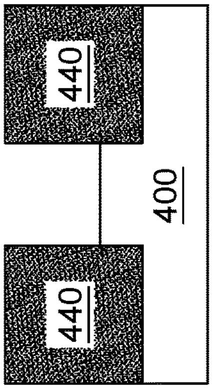
Figure 35A:
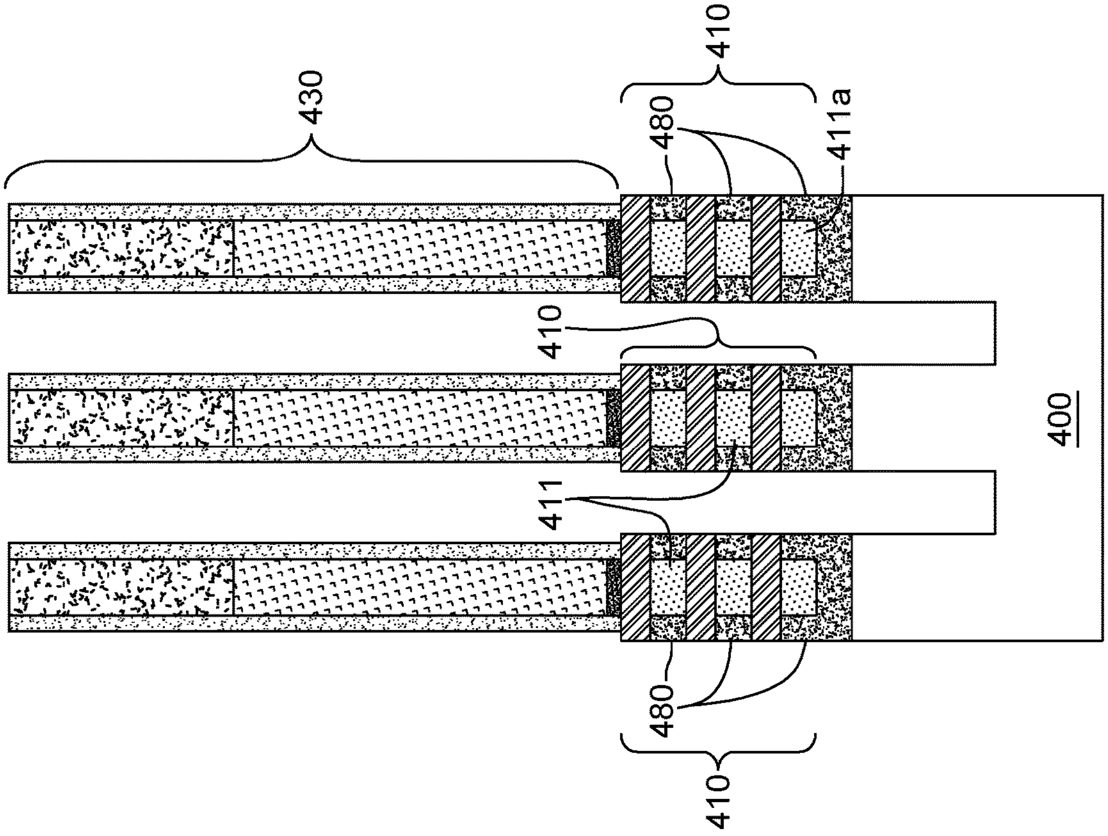

FIGS. 35A, 35B depict removing OPL 470, removing first sacrificial SiGe layer 420, and partially indenting SiGe layers 411 of nanosheet stacks 410 (see FIGS. 34A, 34B). FIG. 35A also depicts the result of forming inner spacers 480 on edges of the indented SiGe layers 411 of each nanosheet stack 410 and beneath a bottom-most SiGe layer 411*a* of each nanosheet stack 410 by depositing inner spacer material on substrate 400 and edges of nanosheet stacks 410 followed by recessing the inner spacer material to form inner spacers 480. Inner spacers 480 may be comprised of, for example, SiBCN, SiNC or SiN.

Figure 36A:
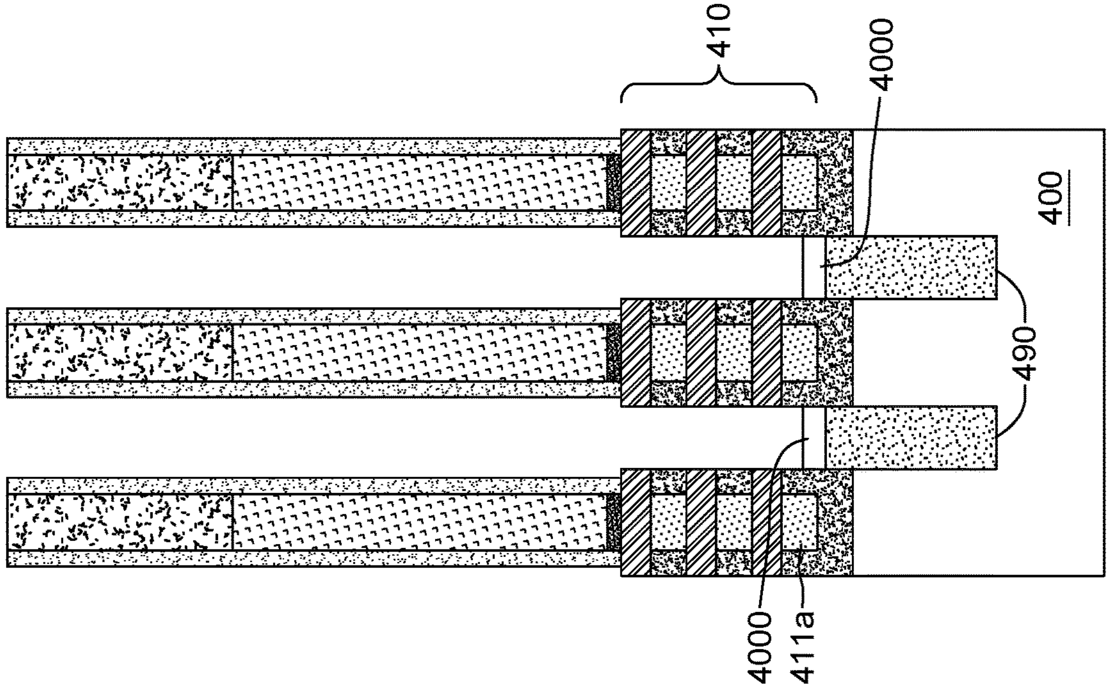
Figure 36B:
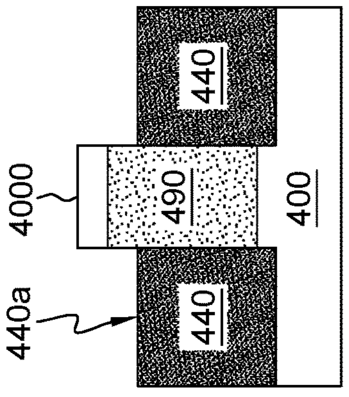

FIGS. 36A, 36B depict epitaxially growing SiGe between adjacent STIs 440 and adjacent nanosheet stacks 410 followed by recessing to a level above a top surface 440*a* of the STIs 440 and below bottom-most SiGe layer 411*a* of each nanosheet stack 410, thereby forming a second sacrificial SiGe layer 490. FIGS. 36A, 36B also depict epitaxially growing Si 4000 on second sacrificial SiGe layer 490. A growth-etch-growth-etch method can be used to form second sacrificial SiGe layer 490.

Figure 37B:
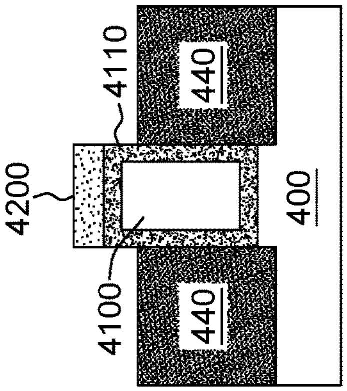
Figure 37A:
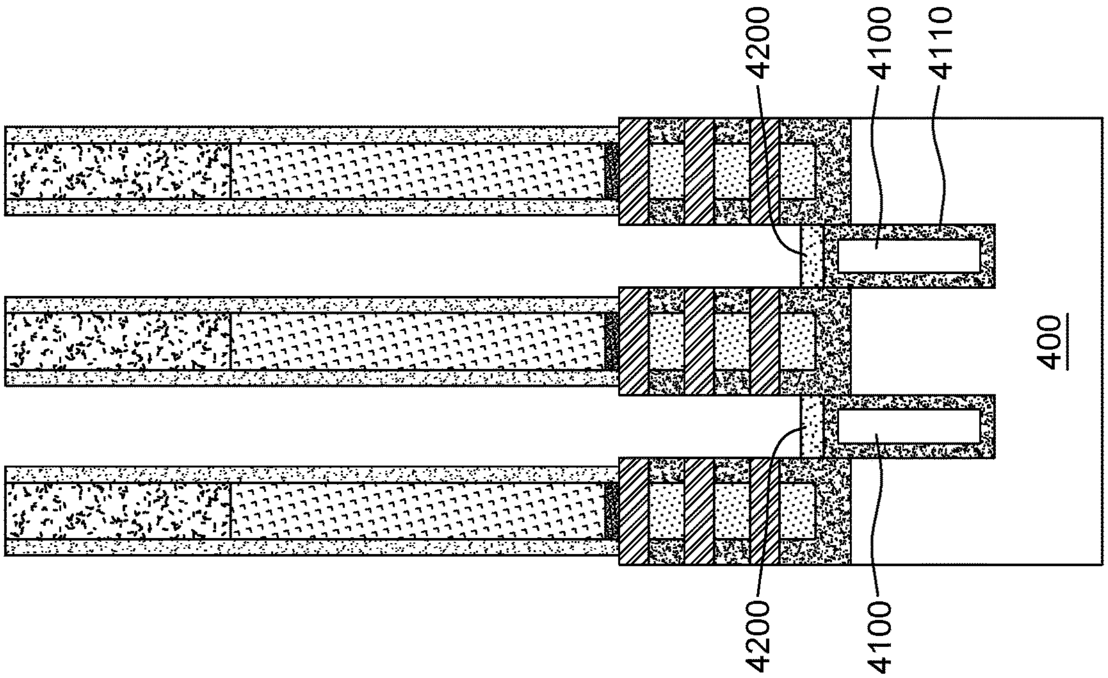

FIGS. 37A, 37B depict selectively removing (e.g., by etching) second sacrificial SiGe layer 490, thereby forming a cavity 4100. FIGS. 37A, 37B also depict the result of depositing a dielectric material 4110 in cavity 4100 and isotropically etching the dielectric material 4110 such that cavity 4100 becomes encapsulated by the dielectric material 4110. In other words, dielectric material 4110 surrounds cavity 4100. The dielectric material may be comprised of, for example, SiBCN, SiNC or SiN. In addition, thinning Si 4000 that was grown on second sacrificial SiGe layer 490 (see FIGS. 36A, 36B) and epitaxially growing $SiGe_{100+}$ on the thinned Si is shown $SiGe_{100+}$ 4200.

Figure 38B:
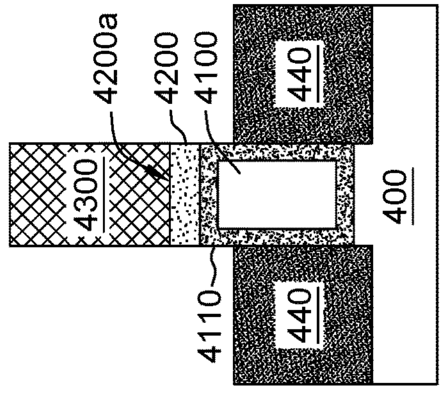
Figure 38A:
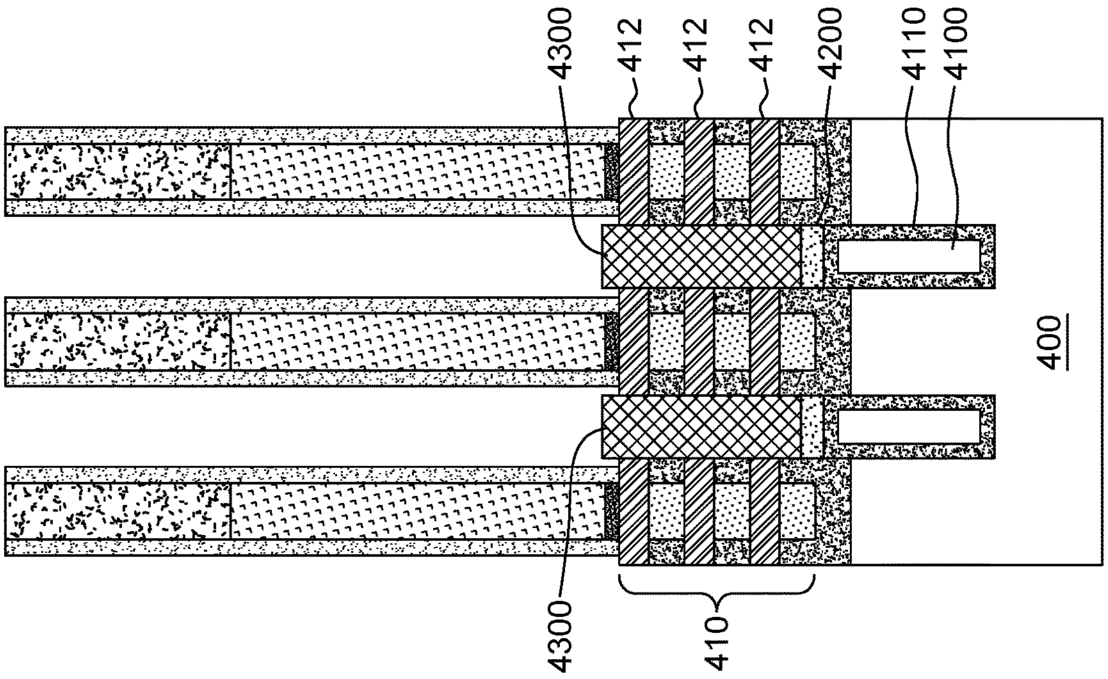

FIGS. 38A, 38B depict the result of epitaxial growth of a S/D epitaxy structure 4300 both horizontally between adjacent nanosheet stacks 410 and from edges of Si layers 412 of nanosheet stacks 410 and vertically from a top surface 4200*a* of $SiGe_{100+}$ 4200.

Figure 39B:
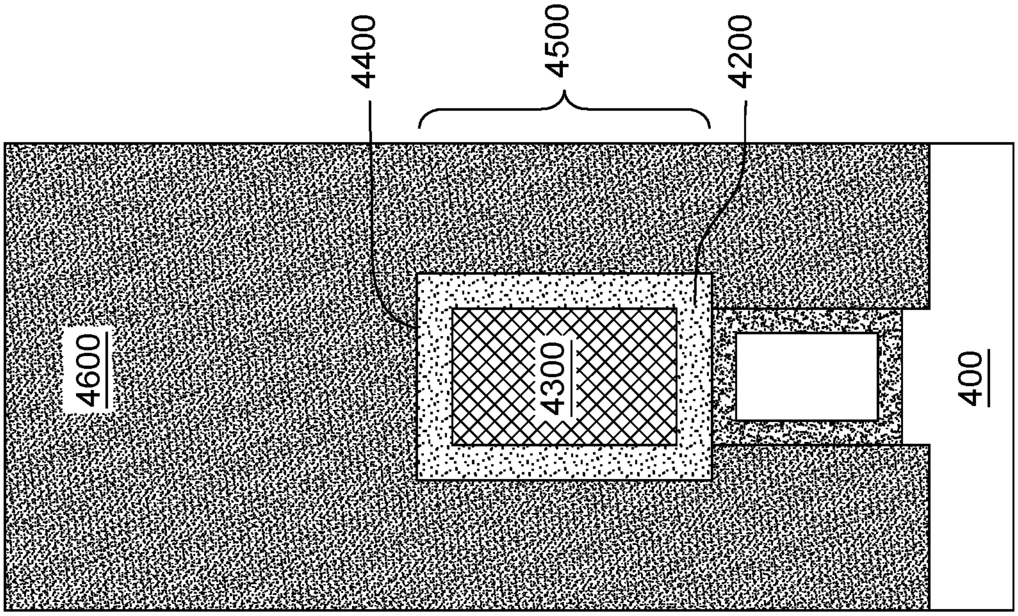
Figure 39A:
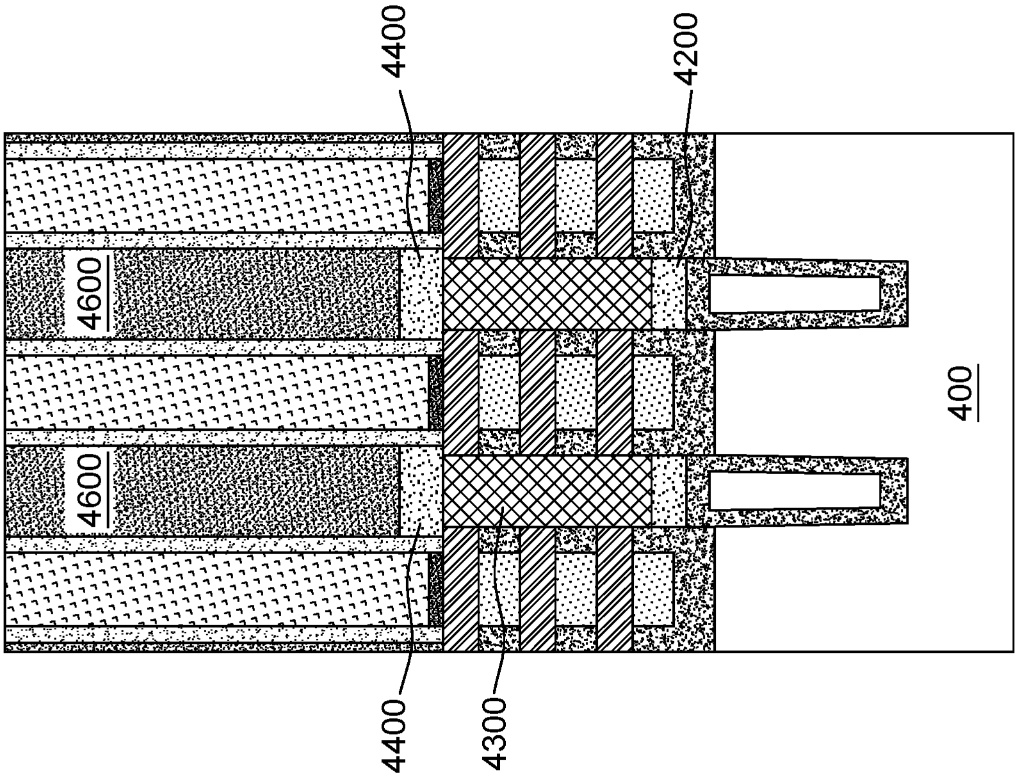

FIGS. 39A, 39B depict forming a sacrificial $SiGe_{100+}$ layer 4400 around S/D epitaxy structure 4300 such that sacrificial $SiGe_{100+}$ layer 4400 merges with $SiGe_{100+}$ 4200 previously formed on the thinned Si 4000 (see FIG. 36A, 36B), thereby forming a sacrificial $SiGe_{100+}$-encapsulated S/D structure 4500. FIGS. 39A, 39B also depict the result of depositing a dielectric fill 4600 on and around sacrificial $SiGe_{100+}$-encapsulated S/D structure 4500.

Figure 40B:
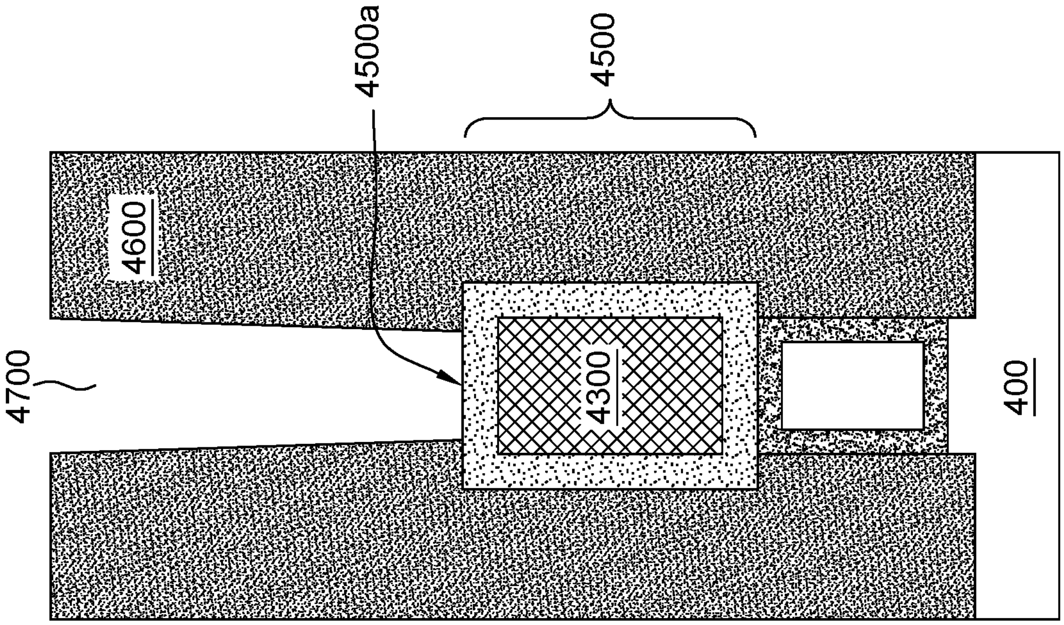
Figure 40A:
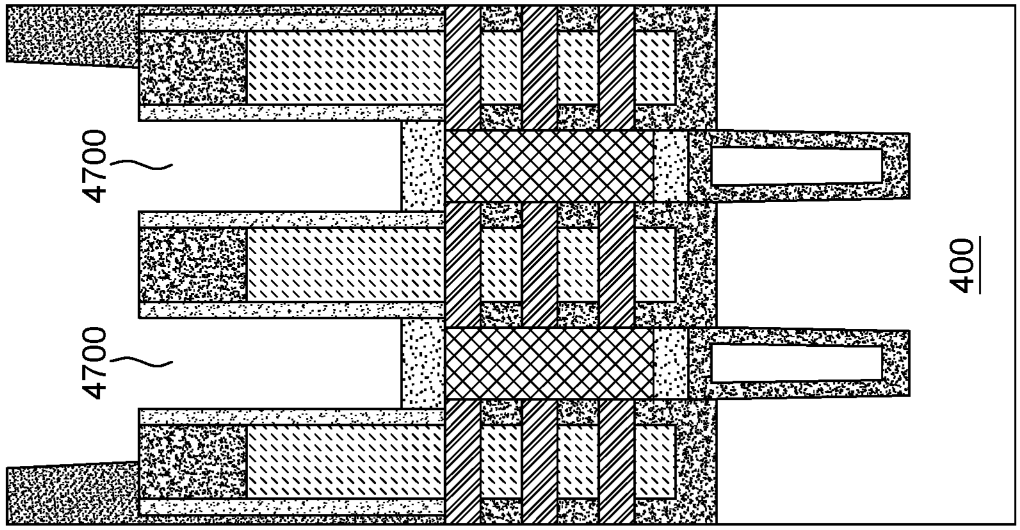
Figure 41B:
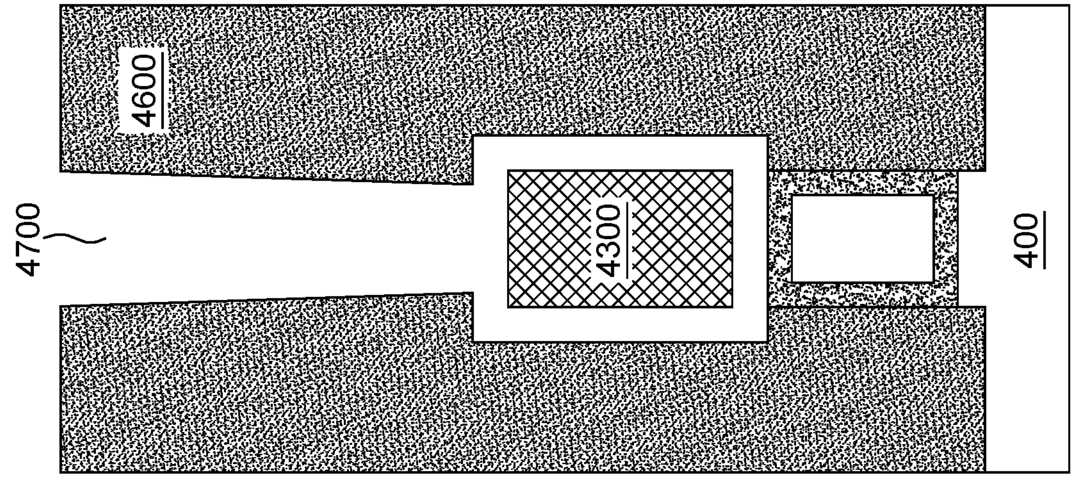
Figure 41A:
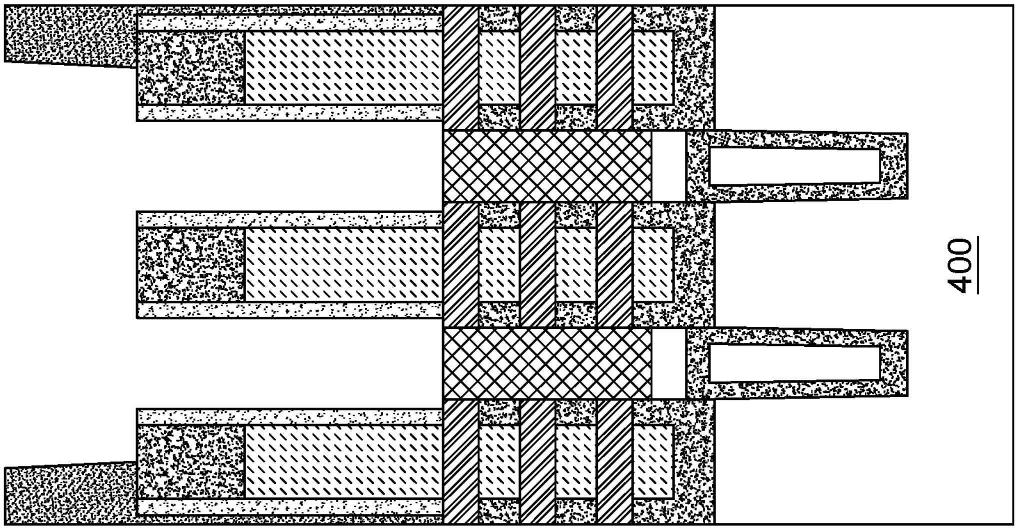

FIGS. 40A, 40B depict etching a trench 4700 through dielectric fill 4600 such that at least a portion of a top surface 4500*a* of sacrificial $SiGe_{100+}$-encapsulated S/D structure 4500 is exposed. Any standard trenching technique can be used.

FIG. 41 depicts removal of $SiGe_{100+}$ that encapsulates the S/D structure 4300 (see also FIGS. 40A, 40B).

Figure 42B:
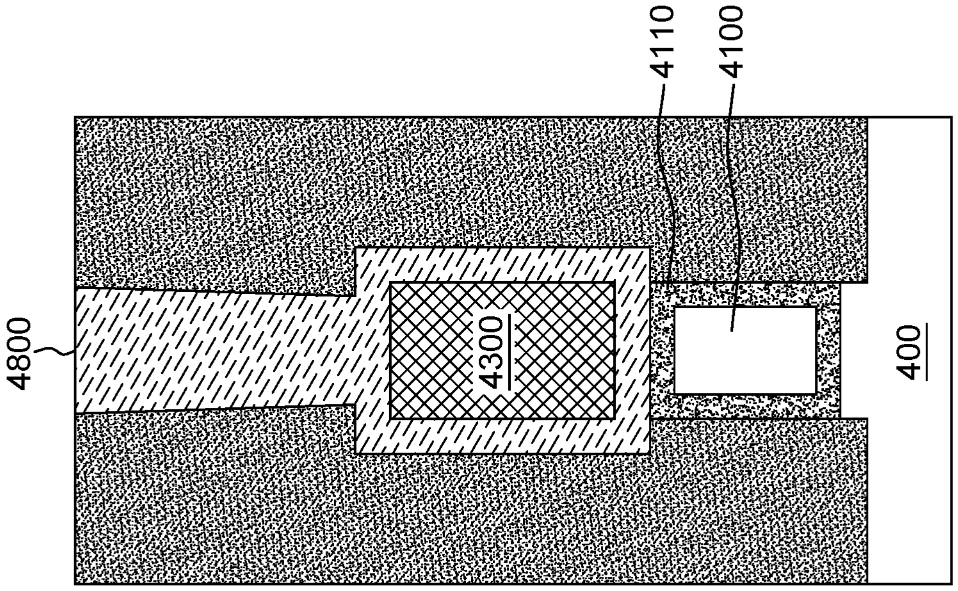
Figure 42A:
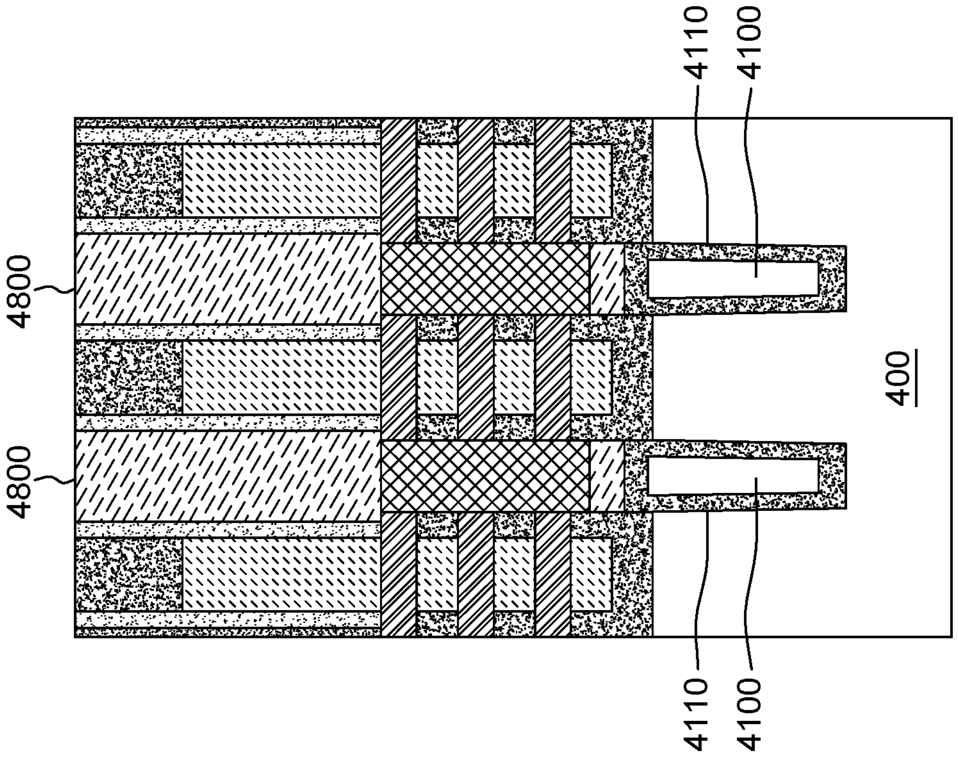

FIGS. 42A, 42B depict forming a conformal contact layer 4800 all around S/D epitaxy structure 4300 and filling trench 4700 (see also FIGS. 41A, 41B), layer 4800 also being referred to as a "wrap-all-around contact." Wrap-all-around contact 4800 provides increased contact interface area. Such increased contact interface area can improve transistor performance. Conformal contact layer 4800 may be comprised of, for example, titanium silicide ($TiSi_x$). It is further noted that cavity 4100 below wrap-all-around contact 4800 remains intact.

In the case of the fourth embodiment of the disclosure, as depicted in FIGS. 42A, 42B, cavity 4100 is an air gap that has been encapsulated by dielectric material 4110. This air gap provides for bottom isolation of S/D epitaxy structure 4300 from the substrate. Such bottom isolation can reduce parasitic S/D leakage to substrate 400.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A field effect transistor (FET) structure having a wrap-all-around contact, comprising:

a substrate;

at least two nanosheet stacks, each nanosheet stack being formed over the substrate;

a gate structure over each nanosheet stack;

a source/drain (S/D) epitaxy structure between adjacent nanosheet stacks;

a conformal or partially conformal contact layer formed all around the S/D epitaxy structure, thereby forming the wrap-all-around contact; and an isolation area located between a lower surface of the wrap-all-around contact and an upper surface of the substrate, wherein the isolation area is an air gap located between the lower surface of the wrap-all-around contact and an upper surface of an oxide layer present on the upper surface of the substrate.

2. The FET structure of claim 1, further comprising a conformal liner layer formed on at least a portion of an outer surface of the wrap-all-around contact.

3. The FET structure of claim 1, wherein the isolation area is encapsulated by a liner material.

4. A field effect transistor (FET) structure having a wrap-all-around contact, comprising:

a substrate having at least two mandrel portions;

a conformal oxide layer on the substrate, the conformal oxide layer having a thickness such that an isolation area between adjacent mandrel portions is present;

a nanosheet stack over each mandrel portion;

a gate structure over each nanosheet stack;

a source/drain (S/D) epitaxy structure between adjacent nanosheet stacks, the S/D epitaxy structure having a shape that does not fill the isolation area and such that a gap is present between the S/D epitaxy structure and an uppermost edge of the oxide layer is present in the isolation area and on sidewalls of the mandrel portions;

a conformal or partially conformal silicide layer formed all around the S/D epitaxy structure and thereby forming the wrap-all-around contact, the silicide layer having a thickness such that the silicide layer does not fill the gap; and a conformal liner layer formed on at least a portion of the silicide layer and having a thickness such that the gap is pinched off by the conformal liner layer.

5. The FET structure of claim 4, wherein the isolation area is an air gap.

6. The FET structure of claim 4, wherein the isolation area is encapsulated by the conformal liner layer and the encapsulated isolation area is an air gap.

7. A method of making a field effect transistor (FET) structure having a wrap-all-around contact, comprising:

forming at least two nanosheet stacks, each nanosheet stack being formed over a substrate;

forming a gate structure over each nanosheet stack;

epitaxially growing a source/drain (S/D) epitaxy structure between adjacent nanosheet stacks; and forming a conformal or partially conformal contact layer all around the S/D epitaxy structure, thereby forming the wrap-all-around contact;

wherein an isolation area is formed below a lower surface of the S/D epitaxy structure and above an upper surface of the substrate wherein the isolation area is an air gap.

8. The method of claim 7, further comprising, before the forming of the nanosheet stacks on the substrate:

forming a sacrificial silicon germanium (SiGe) layer on the substrate such that the sacrificial SiGe layer is between the substrate and each nanosheet stack, each nanosheet stack comprising alternating sheets of silicon germanium (SiGe) and silicon (Si);

before the growing of the S/D epitaxy structure:

removing the sacrificial SiGe layer;

partially indenting the SiGe layers of each nanosheet stack;

depositing an oxide layer on the substrate;

isotropically recessing the oxide layer to a level below a lowest Si layer of each nanosheet stack and no lower than a lowest indented SiGe layer of each nanosheet stack;

depositing inner spacer material on the oxide layer and edges of the nanosheet stacks;

recessing the inner spacer material to form inner spacers on edges of the SiGe layers of each nanosheet stack and an inner spacer layer on a top surface of the oxide layer;

forming the isolation area via directional etching into the oxide layer;

after the forming of the conformal or partially conformal contact layer:

forming a conformal liner layer on at least a portion of an outer surface of the wrap-all-around contact such that the conformal liner layer pinches off a gap present between the wrap-all-around contact and an uppermost inner edge of a sidewall of the isolation area.

9. The method of claim 7, further comprising, before the forming of the nanosheet stacks on the substrate:

forming a first sacrificial silicon germanium (SiGe) layer on the substrate such that the first sacrificial SiGe layer is between the substrate and each nanosheet stack, each nanosheet stack comprising alternating sheets of silicon germanium (SiGe) and silicon (Si).

* * * * *